(12) United States Patent
Yamazaki et al.

(10) Patent No.: US 9,216,557 B2
(45) Date of Patent: Dec. 22, 2015

(54) SEALED STRUCTURE, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Shunpei Yamazaki, Tokyo (JP); Daiki Nakamura, Kanagawa (JP); Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 7 days.

(21) Appl. No.: 13/687,656

(22) Filed: Nov. 28, 2012

(65) Prior Publication Data

US 2013/0134398 A1    May 30, 2013

(30) Foreign Application Priority Data

Nov. 29, 2011   (JP) .................. 2011-260218

(51) Int. Cl.
| | |
|---|---|
| *H01L 51/52* | (2006.01) |
| *B32B 17/00* | (2006.01) |
| *H01L 51/50* | (2006.01) |
| *C03C 8/00* | (2006.01) |

(Continued)

(52) U.S. Cl.
CPC . *B32B 17/00* (2013.01); *C03C 8/00* (2013.01); *C03C 27/00* (2013.01); *H01L 51/5012* (2013.01); *H01L 51/5246* (2013.01); *H01L 27/322* (2013.01); *H01L 27/3246* (2013.01); *H01L 51/5284* (2013.01); *H01L 2251/5361* (2013.01); *Y10T 428/239* (2015.01)

(58) Field of Classification Search
CPC ............ H01L 51/5237; H01L 51/524; H01L 51/5246; H01L 51/525
USPC ...................................... 257/40, 99
See application file for complete search history.

(56) References Cited

U.S. PATENT DOCUMENTS

| | | | |
|---|---|---|---|
| 3,862,830 A | 1/1975 | Stern | |
| 6,317,186 B1 * | 11/2001 | Miwa et al. | 349/153 |

(Continued)

FOREIGN PATENT DOCUMENTS

| | | |
|---|---|---|
| JP | 4-93824 | 8/1992 |
| JP | 8-184839 | 7/1996 |

(Continued)

OTHER PUBLICATIONS

Machine tranlation of JP 2005-353287.*

(Continued)

*Primary Examiner* — Zandra Smith
*Assistant Examiner* — Lauren R Bell
(74) *Attorney, Agent, or Firm* — Husch Blackwell LLP

(57) ABSTRACT

A sealed structure which has high sealing capability and whose border can be slim is provided. The sealed structure includes a pair of substrates whose respective surfaces face each other with a space therebetween, and a glass layer which is in contact with the substrates, defines a space between the substrates, and has at least one corner portion and side portions in continuity with the corner portion. The width of the corner portion of the glass layer is smaller than or equal to that of the side portion of the same. The sealed structure may comprise a highly reliable light-emitting element including a layer containing a light-emitting organic compound provided between a pair of electrodes.

19 Claims, 10 Drawing Sheets

(51) Int. Cl.
*C03C 27/00* (2006.01)
*H01L 27/32* (2006.01)

(56) References Cited

U.S. PATENT DOCUMENTS

| | | |
|---|---|---|
| 6,326,682 B1 | 12/2001 | Kurtz et al. |
| 6,646,284 B2 | 11/2003 | Yamazaki et al. |
| 6,998,776 B2 | 2/2006 | Aitken et al. |
| 7,425,166 B2 | 9/2008 | Burt et al. |
| 7,431,628 B2 | 10/2008 | Park et al. |
| 7,602,121 B2 | 10/2009 | Aitken et al. |
| 7,641,976 B2 | 1/2010 | Lamberson et al. |
| 7,701,136 B2 | 4/2010 | Kwak |
| 7,780,493 B2 | 8/2010 | Choi et al. |
| 7,800,303 B2 * | 9/2010 | Logunov et al. ............... 313/512 |
| 7,837,530 B2 | 11/2010 | Park |
| 7,841,919 B2 | 11/2010 | Lee et al. |
| 7,863,207 B2 | 1/2011 | Son et al. |
| 7,871,949 B2 | 1/2011 | Lee et al. |
| 7,944,143 B2 | 5/2011 | Choi et al. |
| 7,999,468 B2 * | 8/2011 | Lee et al. .................... 313/512 |
| 8,125,146 B2 | 2/2012 | Park |
| 8,164,257 B2 | 4/2012 | Choi et al. |
| 8,192,188 B2 | 6/2012 | Kim |
| 8,545,281 B2 | 10/2013 | Shimomura et al. |
| 2004/0239864 A1 | 12/2004 | Asakawa |
| 2005/0168129 A1 | 8/2005 | Chi |
| 2007/0128966 A1 * | 6/2007 | Becken et al. ................. 445/25 |
| 2007/0170455 A1 | 7/2007 | Choi et al. |
| 2009/0195147 A1 * | 8/2009 | Song et al. ................... 313/504 |
| 2010/0079065 A1 | 4/2010 | Kamiura |
| 2011/0080089 A1 | 4/2011 | Hara et al. |
| 2011/0114991 A1 * | 5/2011 | Lee .............................. 257/100 |
| 2012/0285200 A1 | 11/2012 | Tanaka |
| 2012/0313128 A1 | 12/2012 | Yokoyama et al. |
| 2012/0318023 A1 | 12/2012 | Shimomura |
| 2012/0319092 A1 | 12/2012 | Shimomura |
| 2013/0049062 A1 | 2/2013 | Hatano et al. |
| 2013/0095582 A1 | 4/2013 | Miyairi et al. |
| 2013/0101754 A1 | 4/2013 | Shimomura et al. |

FOREIGN PATENT DOCUMENTS

| | | |
|---|---|---|
| JP | 8-313917 | 11/1996 |
| JP | 2002-258253 | 9/2002 |
| JP | 2005-215681 | 8/2005 |
| JP | 2005-353287 | 12/2005 |
| JP | 2005353287 A * | 12/2005 |
| JP | 2007-200890 | 8/2007 |
| JP | 2010-80339 | 4/2010 |
| JP | 2010-80341 | 4/2010 |
| JP | 2011-65895 | 3/2011 |
| JP | 2011-70797 | 4/2011 |
| JP | 2011-81944 | 4/2011 |
| JP | 2012-41196 | 3/2012 |

OTHER PUBLICATIONS

Machine translation of JP 2005-353287, translated Apr. 17, 2014 (provided with action mailed Apr. 23, 2014).*

* cited by examiner

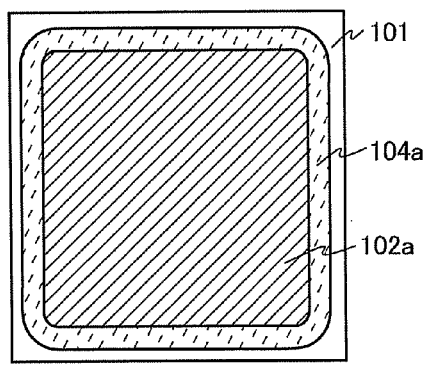
FIG. 1A1
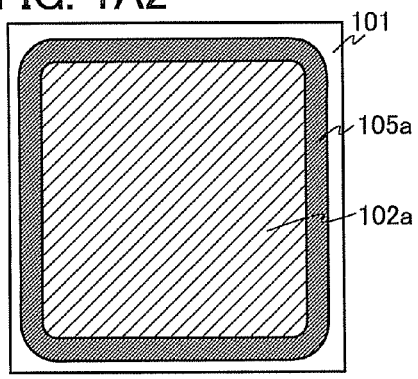
FIG. 1A2
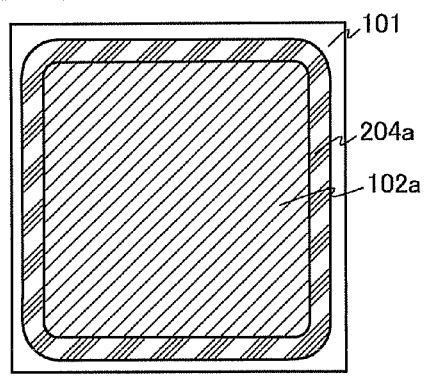
FIG. 1B1
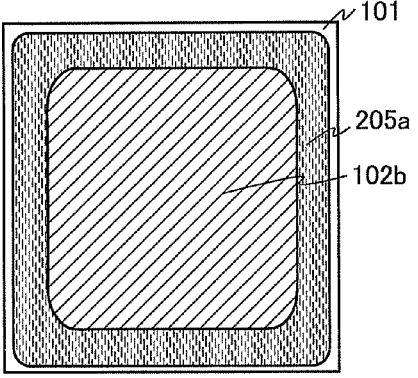
FIG. 1B2
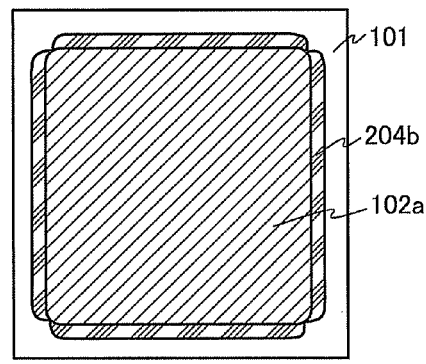
FIG. 1C1
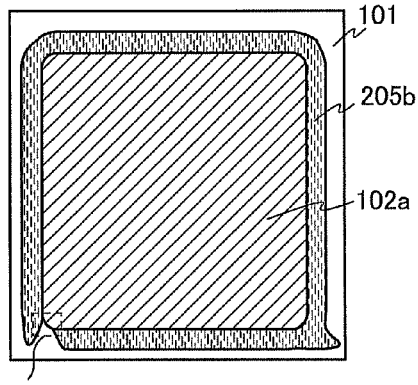
FIG. 1C2

SEALED STRUCTURE, LIGHT-EMITTING DEVICE, ELECTRONIC DEVICE, AND LIGHTING DEVICE

BACKGROUND OF THE INVENTION

1. Field of the Invention

The present invention relates to a sealed structure using a pair of substrates and a glass layer. Further, the present invention relates to a light-emitting device, an electronic device, and a lighting device each using organic electroluminescence (hereinafter also referred to as EL).

2. Description of the Related Art

In recent years, development of light-emitting devices and display devices has been actively promoted, and improvements in reliability and yield, a reduction in device size, a reduction in area except a light-emitting region (display region) (so-called a slim border), and the like have been demanded.

Thus, a sealed structure whose border can be slim, in which the area for an object to be sealed is large has been demanded.

A sealed structure with high sealing capability can be used suitably for a display device or a light-emitting device in which a display element, a light-emitting element, or the like is an object to be sealed.

In particular, in a light-emitting device, an element whose properties such as reliability are rapidly deteriorated by exposure to the air containing moisture or oxygen, such as a light-emitting element using organic electroluminescence (also referred to as an organic EL element), is preferably provided inside a sealed structure with high sealing capability.

Patent Document 1 discloses an organic EL panel in which a substrate and a sealing substrate are attached to each other with an adhesive layer.

REFERENCE

Patent Document 1: Japanese Published Patent Application No. 2011-81944

SUMMARY OF THE INVENTION

As an example of an adhesive for attaching a pair of substrates, resin such as a light curing resin or a heat curing resin is known. Upon attachment of the pair of substrates, the shape of the resin sandwiched by the pair of substrates is changed to, for example, increase its width by crush. That is, the shape of the resin provided over one of the substrates is different between before and after the attachment.

For example, in the case where the application quantity of the resin is large, the resin may spread out of its predetermined region on attachment not only to disturb achievement of a slim border but also to be mixed into a region where an object to be sealed is provided, whereby the object is contaminated. To the contrary, too much reduction in application quantity of the resin in order to suppress the spread out of its appropriate region and achieve a slim border may lead to a lack of sufficient resin in its region after the attachment (the object cannot be sealed enough in some cases).

One object of one embodiment of the present invention is to provide a sealed structure which has high sealing capability and whose border can be slim.

Further, one object of one embodiment of the present invention is to provide a highly reliable light-emitting device whose border can be slim, in which an organic EL element is sealed by the sealed structure.

Still further, one object of one embodiment of the present invention is to provide a highly reliable electronic device or a highly reliable lighting device whose border can be slim and which uses the light-emitting device.

A sealed structure of one embodiment of the present invention includes a pair of substrates respective surfaces of which face each other with a space therebetween, and a glass layer which is in contact with both of the substrates, defines a space between the substrates, and has at least one corner portion in continuity with side portions. The width of the corner portion of the glass layer is smaller than or equal to that of the side portion of the same.

In this specification, the interval between an inner contour and an outer contour of the glass layer is referred to as the width of the glass layer. In this specification, for example, the interval between the inner contour and the outer contour in the corner portion (side portion) of the glass layer is referred to as the width of the corner portion (side portion).

With the above-described structure, a sealed structure which has high sealing capability and whose border can be slim can be achieved.

Spreading of the adhesive out of its appropriate region upon attachment can be more suppressed in the sealed structure by using the glass for attaching the pair of substrates than in the case of using resin. Accordingly, a slim border of the sealed structure can be achieved.

Further, the sealing capability of glass is higher than that of resin, and thus glass is preferable. In addition, glass is less likely to be deformed on attachment, and thus the shape of the glass layer after attachment can be predicted before the attachment, which enables suppression of generation of such a defect that the glass layer does not exist in its predetermined region after the attachment and thus an object to be sealed cannot be sealed enough. Accordingly, a sealed structure with high sealing capability can be manufactured at high yield.

Further, the glass layer (or glass frit, frit paste, or the like for forming the glass layer) can be provided over the substrate, in its desired shape after attachment, which leads to simplification of manufacturing of the sealed structure.

In fabricating or using a sealed structure, force is more likely to be applied to a corner portion of the sealed structure, so that the pair of attached substrates tends to be detached from each other from the corner portion. Therefore, it is preferable that the adhesion between the glass layer and the substrate be high in the corner portion of the sealed structure. Specifically, in the corner portion of the glass layer, it is preferable that a region which is not welded to the substrate be as small as possible, and it is more preferable that the entire surface of the glass layer be welded to the substrate.

If the width of the corner portion of the glass layer is larger than that of the side portion of the same, when the side portion is irradiated with laser light with a beam diameter which is selected in accordance with the width of the corner portion, an object sealed by the sealed structure is also irradiated with the laser light, which may damage the object.

To the contrary, if the beam diameter of the laser is selected in accordance with the width of the side portion, there occurs a region which is not welded to the substrate in the corner portion of the glass layer.

However, since the width of the corner portion is smaller than or equal to that of the side portion in the glass layer in the above-described sealed structure of one embodiment of the present invention, the glass layer can be surely welded to the substrate in the corner portion while suppressing damage of laser light on an object sealed by the sealed structure. Accordingly, application of one embodiment of the present invention can provide a sealed structure achieving both of high sealing capability and a slim border, in which damage of laser light on an object sealed by the sealed structure is suppressed.

Note that the present invention encompasses not only a structure in which the substrate is in direct contact with the glass layer, but also a structure in which the substrate is in indirect contact with the glass layer through a film provided over the substrate. In this specification, a welding (region) between the substrate and the glass layer may denote a welding (region) between the film provided over the substrate and the glass layer, depending on the structure.

A light-emitting device of one embodiment of the present invention includes a pair of substrates respective surfaces of which face each other with a space therebetween, and a glass layer which is in contact with both of the substrates, defines a region for an object to be sealed between the substrates, and has at least one corner portion in continuity with side portions. The region for an object to be sealed includes a light-emitting element (also referred to as organic EL element) in which a layer containing a light-emitting organic compound is provided between a pair of electrodes. The width of the corner portion of the glass layer is smaller than or equal to that of the side portion of the same.

With the above-described structure, a light-emitting device which has high reliability and whose border can be slim can be achieved.

Spreading of the adhesive out of its appropriate region upon attachment can be more suppressed in the light-emitting device by using the glass for attaching the pair of substrates than in the case of using resin. Accordingly, a slim border of the light-emitting device can be achieved.

Further, the sealing capability of glass is high, whereby deterioration of the organic EL element due to moisture, oxygen, and the like can be suppressed. In addition, glass is less likely to be deformed on attachment, and thus the shape of the glass layer after attachment can be predicted before the attachment, which enables suppression of generation of such a defect that the glass layer does not exist in its predetermined region after the attachment and thus the object cannot be sealed enough. Accordingly, a light-emitting device with high reliability can be manufactured at high yield.

Further, the glass layer (or glass frit, frit paste, or the like for forming the glass layer) can be provided over the substrate, in its desired shape after attachment, which leads to simplification of manufacturing of the light-emitting device.

Further, as described above, in the corner portion of the glass layer, it is preferable that a region which is not welded to the substrate be as small as possible, and it is more preferable that the entire surface of the glass layer be welded to the substrate. In addition, the organic EL element, which is provided as the object sealed by the light-emitting device of one embodiment of the present invention, contains a low heat-resistant material in many cases, and thus it is not preferable for the organic EL element to be irradiated with laser light.

However, since the width of the corner portion is smaller than or equal to that of the side portion in the glass layer in the above-described light-emitting device of one embodiment of the present invention, the glass layer can be surely welded to the substrate in the corner portion while suppressing damage of laser light on the organic EL element. Accordingly, application of one embodiment of the present invention can provide a light-emitting device achieving both of high reliability and a slim border, in which damage of laser light on an organic EL element is suppressed.

One embodiment of the present invention is an electronic device using the light-emitting device. One embodiment of the present invention is a lighting device using the light-emitting device. Application of the light-emitting device enables an electronic device or a lighting device which has high reliability and whose border can be slim to be achieved.

According to one embodiment of the present invention, a sealed structure which has high sealing capability and whose border can be slim can be provided.

Further, a light-emitting device which has high reliability and whose border can be slim, in which an organic EL element is sealed by the sealed structure can be provided.

Still further, an electronic device or a lighting device using the light-emitting device, which has high reliability and whose border can be slim can be provided.

BRIEF DESCRIPTION OF THE DRAWINGS

In the accompanying drawings:

FIGS. 1A1 and 1A2, FIGS. 1B1 and 1B2, and FIGS. 1C1 and 1C2 illustrate a sealed structure of one embodiment of the present invention, a sealed structure of a comparison example, and a sealed structure of a comparison example, respectively;

DETAILED DESCRIPTION OF THE INVENTION

Figure 2A:
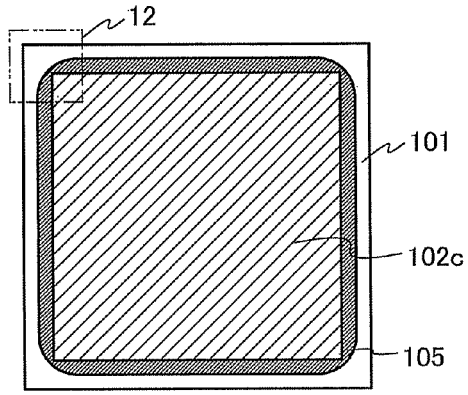
FIGS. 2A to 2E illustrate sealed structures of embodiments of the present invention.

Embodiments of the present invention are described in detail using the drawings. The present invention is not limited to the following description, and it will be easily understood by those skilled in the art that various changes and modifications can be made without departing from the spirit and scope of the present invention. Therefore, the present invention should not be construed as being limited to the description in the following embodiments. In the structures of the present invention described below, the same portions or portions having similar functions are denoted by the same reference numerals in the drawings, and description of the portions is not repeated.

(Embodiment 1)

In this embodiment, a sealed structure of one embodiment of the present invention is described using FIGS. 1A1 and 1A2, FIGS. 1B1 and 1B2, FIGS. 1C1 and 1C2, and FIGS. 2A to 2E.

A sealed structure of one embodiment of the present invention includes a pair of substrates respective surfaces of which face each other with a space therebetween, and a glass layer which is in contact with both of the substrates, defines a space between the substrates, and has at least one corner portion in continuity with side portions. The width of the corner portion of the glass layer is smaller than or equal to that of the side portion of the same.

Spreading of the adhesive out of its appropriate region upon attachment can be more suppressed in the sealed structure by using the glass for attaching the pair of substrates than in the case of using resin. Accordingly, a slim border of the sealed structure can be achieved.

Further, the sealing capability of glass is higher than that of resin, and thus glass is preferable. In addition, glass is less likely to be deformed on attachment, and thus the shape of the glass layer after attachment can be predicted before the attachment, which enables suppression of generation of such a defect that the glass layer does not exist in its predetermined region after the attachment and thus an object to be sealed cannot be sealed enough. Accordingly, a sealed structure with high sealing capability can be manufactured at high yield.

Further, the glass layer (or glass frit, frit paste, or the like for forming the glass layer) can be provided over the substrate, in its desired shape after attachment, which leads to simplification of manufacturing of the sealed structure.

In fabricating or using a sealed structure (or a light-emitting device using a sealed structure), force is more likely to be applied to a corner portion of the sealed structure, so that the pair of attached substrates tends to be detached from each other from the corner portion. Therefore, it is preferable that, the adhesion between the glass layer and the substrate be high in the corner portion of the sealed structure. Specifically, in the corner portion of the glass layer, it is preferable that a region which is not welded to the substrate be as small as possible, and it is more preferable that the entire surface of the glass layer be welded to the substrate.

If the width of the corner portion of the glass layer is larger than that of the side portion of the same, when the side portion is irradiated with laser light with a beam diameter which is selected in accordance with the width of the corner portion, an object sealed by the sealed structure is also irradiated with the laser light, which may damage the object. Particularly in the case where a slim border is achieved and the object to be sealed is near the glass layer, the object is more likely to be irradiated with the laser light.

To the contrary, if the beam diameter of the laser is selected in accordance with the width of the side portion, there occurs a region which is not welded to the substrate in the corner portion of the glass layer.

Moreover, if the beam diameter of the laser is adjusted in accordance with either the width of the side portion or the width of the corner portion depending on the portion for irradiation, the number of manufacturing steps of a sealed structure is increased.

However, since the width of the corner portion is smaller than or equal to that of the side portion in the glass layer in the above-described sealed structure of one embodiment of the present invention, the glass layer can be surely welded to the substrate in the corner portion while suppressing damage of laser light on an object sealed by the sealed structure. Accordingly, application of one embodiment of the present invention can provide a sealed structure achieving both of high sealing capability and a slim border, in which damage of laser light on an object sealed by the sealed structure is suppressed.

First, a sealed structure of one embodiment of the present invention is described using FIGS. 1A1 and 1A2.

A plan view of a substrate 101 in a state just before being attached to a counter substrate is shown in FIG. 1A1. A plan view of a sealed structure of one embodiment of the present invention is shown in FIG. 1A2.

A glass layer 104a is provided over the substrate 101 which is quadrangular as shown in FIG. 1A1 such that its inner contour is along the periphery of a region for an object to be sealed 102a.

In the sealed structure of one embodiment of the present invention shown in FIG. 1A2, a glass layer 105a is provided over the substrate 101 such that its inner contour is along the periphery of the region for an object to be sealed 102a. The substrate 101 is attached to the counter substrate (not shown) with the glass layer 105a. The region for an object to be sealed 102a is positioned in a space surrounded by the pair of substrates and the glass layer 105a. As for the glass layer 105a, the width of a corner portion is equal to that of a side portion.

In this embodiment, the area of a surface of the substrate and that of a surface of the counter substrate which faces the surface of the substrate are equal to each other. For example, in the plan view of the sealed structure shown in FIG. 1A2, the shape of the counter substrate is the same as that of the substrate 101.

The region for an object to be sealed is a region where an object to be sealed can be provided. Specifically, in the sealed structure of one embodiment of the present invention, an object to be sealed can be provided in the region for an object to be sealed 102a over the substrate 101 or a region over the counter substrate which overlaps with the region for an object to be sealed 102a. There is no particular limitation on the object to be sealed; for example, an organic EL element, an element included in a plasma display, a liquid crystal element, and the like can be given. A transistor, a color filter, or the like may also be provided.

<Manufacturing Method of Sealed Structure of One Embodiment of the Present Invention>

The glass layer 105a in the sealed structure of one embodiment of the present invention can be formed of glass frit, for example. A glass ribbon can also be used. The glass frit or the glass ribbon contains at least a glass material.

The glass frit contains a glass material as a frit material; for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass is contained. The glass frit preferably contains at least one or more kinds of transition metals to absorb infrared light.

In this embodiment, the glass layer 105a is formed of glass frit over the substrate 101. A manufacturing method described in this embodiment allows manufacturing of a sealed structure by which an object to be sealed whose heat resistance is lower than that of the glass layer 105a (the object is, for example, an organic EL element or a color filter) is sealed. Although the manufacturing process of the object is omitted below, the object is provided in the region for an object to be sealed 102a over the substrate 101 or the region over the counter substrate which overlaps with the region for an object to be sealed 102a before a step of laser light irradiation to the glass layer 104a.

In the case where the glass layer and the object to be sealed are provided over the same substrate, the order of formation of the structure and the glass layer is not limited. The glass layer and the object may be provided over different substrates. Formation of the glass layer may involve a heat treatment; thus, it is preferable that the glass layer and the object be provided over different substrates in the case where the hear resistance of the object is low.

First, frit paste is applied over the substrate 101 by a printing method such as screen printing or gravure printing, a dispensing method, or the like. In particular, use of the printing method such as screen printing or gravure printing is preferable because the frit paste can be formed easily into a desired shape. The difference between the shape of the resulting glass layer 105*a* and the shape of this frit paste is small, and therefore the frit paste is preferably provided in its desired shape after attachment. That is, the frit paste is provided such that its inter contour is along the periphery of the region for an object to be sealed 102*a*. In this embodiment, the frit paste is formed into a shape similar to that of the glass layer 105*a*, over the substrate 101.

The frit paste contains the frit material and a resin (also referred to as a binder) diluted by an organic solvent. As for the frit paste, a known material and a known composition can be used. For example, terpineol, n-butyl carbitol acetate, or the like can be used as the organic solvent and a cellulosic resin such as ethylcellulose can be used as the resin. Further, an absorbent of light with a wavelength of laser light may be contained in the frit paste.

Next, pre-baking is performed thereon to remove the resin or binder in the frit paste, so that the glass layer 104*a* is formed (FIG. 1A1).

The top surface of the glass layer 104*a* is preferably flat to increase the adhesion to the counter substrate. Thus, a planarization treatment such as application of pressure may be performed thereon. The planarization treatment can be performed before or after the pre-baking.

Then, the substrate 101 and the counter substrate are disposed to face each other to make the glass layer 104*a* and the counter substrate in close contact with each other, and the glass layer 104*a* is irradiated with the laser light. For example, the beam diameter of the laser light is preferably greater than or equal to the width between the outer contour and the inner contour of the glass layer 104*a*, because the entire surface of the glass layer 104*a* can be welded to the contour substrate easily, whereby the sealing capability of the sealed structure of one embodiment of the present invention can be increased. Further, in the case of using a beam diameter which is greater than that width, it is preferable that the object to be sealed be not irradiated with the laser light.

Through the above, the sealed structure of one embodiment of the present invention, in which the substrate 101 and the counter substrate are attached to each other with the glass layer 105*a* can be fabricated (FIG. 1A2).

As shown in FIGS. 1A1 and 1A2, the shape difference between the glass layer 104*a* resulted by the pre-baking on the glass frit and the glass layer 105*a* resulted by the irradiation with the laser light to be welded to the counter substrate is small in the sealed structure of one embodiment of the present invention. That is, the shape of the glass layer is less likely to be changed on attachment between the substrate and the counter substrate. Thus, such attachment of the pair of substrates with glass enables suppression of spreading of the adhesive out of its predetermined region upon the attachment. Accordingly, with one embodiment of the present invention, a slim border of the sealed structure can be achieved. Further, glass can be prevented from mixing into the region for an object to be sealed, thereby suppressing contamination of the object.

Further, the glass layer is less likely to be deformed on attachment, and thus the shape of the glass layer after attachment can be predicted before the attachment, which enables suppression of generation of such a defect that the glass layer does not exist in its predetermined region after the attachment and thus an object to be sealed cannot be sealed enough. Accordingly, a sealed structure which has high sealing capability and whose border can be slim can be manufactured at high yield.

Further, for example, a defect portion where the glass layer 104*a* does not exist in its region can be detected; thus, the substrate 101 having this defect portion can be removed from the manufacturing process, thereby reducing execution of an unnecessary manufacturing process; alternatively, frit paste may be further applied over that substrate 101, and pre-baking may be performed thereon again, whereby the defect portion can be repaired. In this manner, according to one embodiment of the present invention, a reduction in yield can be suppressed by detecting a defect portion before attachment.

Next, sealed structures of comparison examples are described using FIGS. 1B1 and 1B2, and FIGS. 1C1 and 1C2. In this embodiment, sealed structures in each of which a substrate 101 and a counter substrate are attached to each other with resin are given as the comparison examples.

Plan views of the substrates 101 in a state just before being attached to the counter substrate are shown in FIG. 1B1 and 1C1. Plan views of sealed structures of comparison examples are shown in FIGS. 1B2 and 1C2.

A resin layer 204*a* is provided over the substrate 101 which is quadrangular as shown in FIG. 1B1 such that its inner contour is along the periphery of a region for an object to be sealed 102*a*.

In the sealed structure of the comparison example shown in FIG. 1B2, a resin layer 205*a* is provided over the substrate 101 so as to surround a region for an object to be sealed 102*b*. The substrate 101 is attached to the counter substrate (not shown) with the resin layer 205*a*. The region for an object to be sealed 102*b* is positioned in a space surrounded by the pair of substrates and the resin layer 205*a*.

Upon the attachment between the substrate 101 and the counter substrate, the shape of the resin layer 204*a* sandwiched therebetween is changed to, for example, increase its width by crush. Therefore, the width between the inner contour and the outer contour of the resin layer 205*a* in the sealed structure shown in FIG. 1B2 is larger than that between the inner contour and the outer contour of the resin layer 204*a* over the substrate 101 shown in FIG. 1B1. Further, the area of the region for an object to be sealed 102*b* is smaller than that of the region for an object to be sealed 102*a*; a slim border is not achieved.

As described above, resin is more likely to spread out of its predetermined region on attachment of the pair of the substrates. Consequently, the area of the region for an object to be sealed becomes small, and it is difficult to achieve a slim border. Further, the object may be contaminated by mixing of the resin into the region for an object to be sealed, which is not preferable.

A resin layer 204*b* is provided over the substrate 101 which is quadrangular as shown in FIG. 1C1 such that its inner contour is along the periphery of a region for an object to be sealed 102*a*.

In the sealed structure of the comparison example shown in FIG. 1C2, a resin layer 205*b* is provided over the substrate 101 so as to surround the region for an object to be sealed 102*a*. The substrate 101 is attached to the counter substrate (not shown) with the resin layer 205*b*.

The application quantity of the resin layer 204*b* in FIG. 1C1 is smaller than that of the resin layer 204*a* in FIG. 1B1. Consequently, the area of the region for an object to be sealed 102*a* is not changed, even by crushing the resin with the pair of substrates on attachment in the sealed structure of the comparison example shown in FIG. 1C2. However, there is a portion surrounded by a dotted line 11, where the resin does not exist. If the resin does not exist in its predetermined region, an object cannot be sufficiently sealed by the sealed structure.

As described above, too much reduction in application quantity of the resin in order to suppress the spread out of its appropriate region may lead to a lack of sufficient resin in its region after the attachment, resulting in a lack of sealing capability of the sealed structure.

Therefore, achieving of both of a slim border and high sealing capability is difficult in the sealed structure using resin.

On the other hand, the sealed structure of one embodiment of the present invention uses the glass layer for attaching the pair of substrates. Such attachment of the pair of substrates with the glass enables more suppression of spreading of the adhesive out of its predetermined region than the case of using resin. Accordingly, a slim border of the sealed structure can be achieved.

Further, the glass layer is less likely to be deformed on attachment, and thus the shape of the glass layer after attachment can be predicted before the attachment, which enables suppression of generation of such a defect that the glass layer does not exist in its predetermined region after the attachment and thus an object to be sealed cannot be sealed enough. Accordingly, a sealed structure which has high sealing capability and whose border can be slim can be manufactured at high yield.

A plan view of a sealed structure of another embodiment of the present invention is shown in FIG. 2A.

In a sealed structure of one embodiment of the present invention shown in FIG. 2A, a glass layer 105$b$ is provided over a substrate 101 such that its inner contour is along the periphery of a region for an object to be sealed 102$c$. The substrate 101 is attached to a counter substrate (not shown) with the glass layer 105$b$. The region for an object to be sealed 102$c$ is positioned in a space surrounded by the pair of substrates and the glass layer 105$b$.

In the glass layer 105$b$, the width of a corner portion is smaller than that of a side portion. A beam diameter of laser light selected in accordance with the width of the side portion allows the glass layer 105$b$ and the counter substrate to be surely welded to each other even in the corner portion (there occurs almost no portion of the glass layer 105$b$ which is not welded to the counter substrate). Therefore, the glass layer 105$b$ and the counter substrate can be welded to each other more surely while suppressing damage of the laser light on an object to be sealed, than in the case where the width of the corner portion is larger than that of the side portion. Accordingly, a sealed structure with high sealing capability can be provided.

As shown in the glass layer 105$b$ shown in FIG. 2A, the inner contour in the corner portion of the glass layer may have an angle. In the case where the inner contour has an angle, the angle is any of a right angle, an acute angle, and an obtuse angle.

Figure 2B:
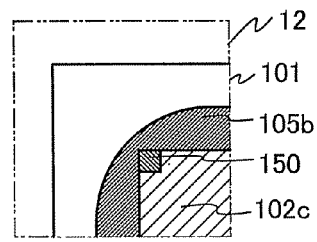

An enlarged view of a portion surrounded by a dotted line 12 in FIG. 2A is shown in FIG. 2B. For forming the glass layer 105$b$ whose inner contour has an angle shown in FIG. 2A, a structure having an angle 150 as shown in FIG. 2B may be formed over the substrate 101 to shape the glass layer 105$b$ (glass frit or frit paste for forming the glass layer 105$b$). For example, the structure 150 can be provided in the region for an object to be sealed 102$c$. In the case where the structure 150 is provided in the region for an object to be sealed 102$c$, the structure 150 is preferably removed after the glass layer is shaped, because the area of the region for an object to be sealed 102$c$ cannot be decreased and thus a slim border is achieved. The structure 150 may also be provided outside the region for forming the glass layer. In the case of using a low-viscosity frit paste, the frit paste may be less likely to keep its shape due to surface tension or the like; in that case, such a structure is preferably provided over the substrate regardless of the shape of the glass layer, which enables the frit paste to be formed easily into an appropriate shape.

Figure 2C:
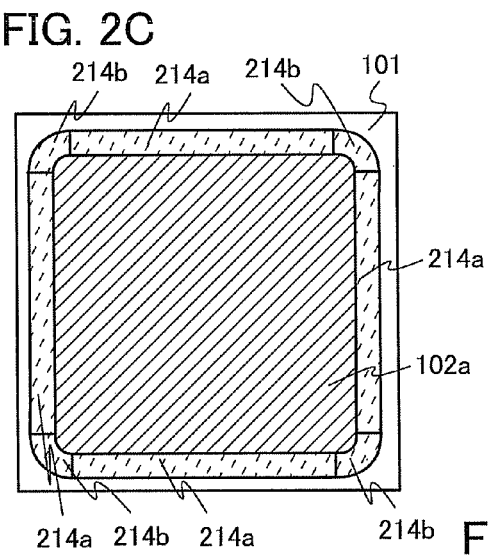

Further, in order to obtain the glass layer (or glass frit or frit paste) with an appropriate shape, an application step or a pre-baking step of the frit paste may be divided into several times. For example, as shown in FIG. 2C, the application step and the pre-baking step of the frit paste can be performed separately in a side portion 214$a$ and a corner portion 214$b$. Specifically, first, frit paste is applied to a region for the side portion 214$a$, and pre-baking is performed thereon; then, frit paste is applied to a region for the corner portion 214$b$, and pre-baking is performed thereon.

Figure 2D:
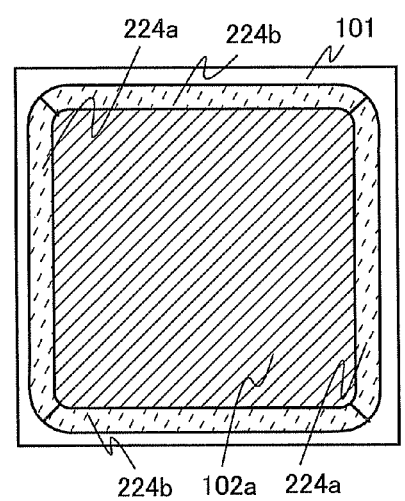

Alternatively, as shown in FIG. 2D, an application step and a pre-baking step of the fit paste can be performed separately in one pair of facing side portions 224$a$ and the other pair of facing side portions 224$b$. Specifically, first, frit paste is applied to regions for the one pair of facing side portions 224$a$, and pre-baking is performed thereon; then, frit paste is applied to regions for the other pair of facing side portions 224$b$, and pre-baking is performed thereon.

Figure 10A:
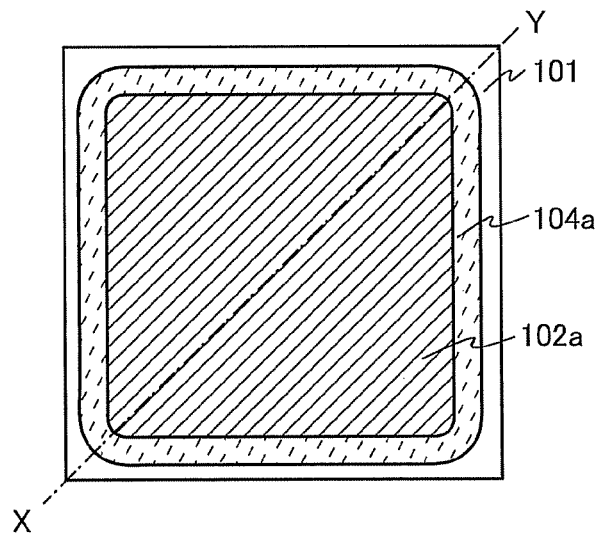
FIGS. 10A to 10C illustrate a sealed structure of one embodiment of the present invention and a manufacturing method thereof.
Figure 10B:
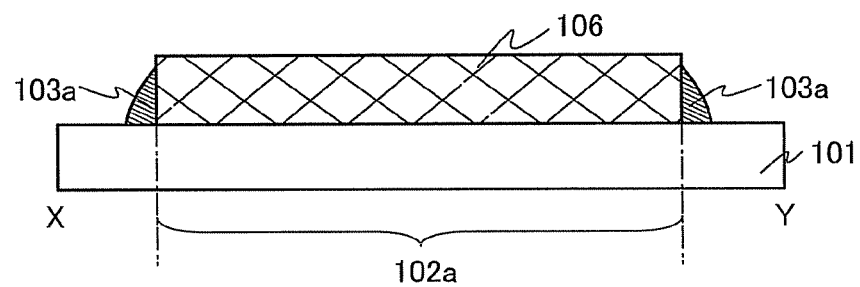
Figure 10C:
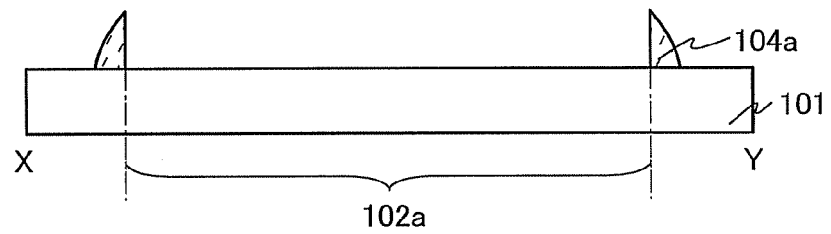

A part of a method for manufacturing a sealed structure of one embodiment of the present invention is described using FIGS. 10A to 10C.

A plan view of the substrate 101 just before the attachment to the counter substrate is shown in FIG. 10A.

A glass layer 104$a$ is provided over a substrate 101 which is quadrangular as shown in FIG. 10A such that its inner contour is along the periphery of a region for an object to be sealed 102$a$.

FIGS. 10B and 10C are cross-sectional views taken along chain line X-Y in FIG. 10A.

First, a masking tape 106 is provided in the region for an object to be sealed 102$a$ over the substrate 101. The masking tape 106 is not necessarily in contact with the substrate 101. For example, the masking tape 106 may be provided to cover an object to be sealed whose heat resistance is high (enough to withstand at least pre-baking and the like performed later), which is provided over the substrate 101.

Next, frit paste 103$a$ is applied along the side surface of the masking tape 106 (FIG. 10B).

Then, the frit paste 103$a$ is dried to lose its fluidity and become solid to keep its shape, and then, the masking tape 106 is removed from the substrate 101.

After that, pre-baking is performed on the frit paste 103$a$, so that the glass layer 104$a$ is formed (FIG. 10C).

In the sealed structure fabricated through the above process, the glass layer is provided such that its inner contour is along the periphery of the region for an object to be sealed 102$a$. Spreading of the adhesive out of its appropriate region upon attachment can be more suppressed by using the glass for attaching the pair of substrates than in the case of using resin. Accordingly, a slim border of the sealed structure can be achieved.

Further, the pair of substrates is attached to each other with the glass layer in the sealed structure fabricated through the above process. Further, the sealing capability of glass is higher than that of resin, and thus glass is preferable. In addition, glass is less likely to be deformed on attachment, and thus the shape of the glass layer after attachment can be predicted before the attachment, which enables suppression of generation of such a defect that the glass layer does not exist in its predetermined region after the attachment and thus an object to be sealed cannot be sealed enough. Accordingly, a sealed structure with high sealing capability can be manufactured at high yield.

Further, the frit paste 103a can be provided over the substrate, in its desired shape after attachment, which leads to simplification of manufacturing of the sealed structure.

Figure 2E:
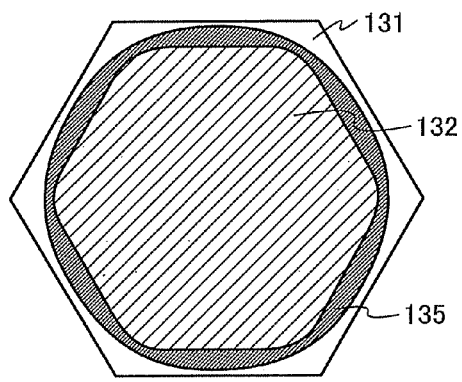

FIG. 2E is a plan view of a sealed structure of another embodiment of the present invention. The shape of a substrate of the sealed structure of one embodiment of the present invention is not limited to quadrangle in the plan view. For example, as shown in FIG. 2E, a substrate the shape of which is hexagonal in the plan view can be used in one embodiment of the present invention.

In a sealed structure shown in FIG. 2E, a glass layer 135 is provided over a substrate 131 the shape of which is hexagonal, such that its inner contour is along the periphery of a region for an object to be sealed 132. Then, the substrate 131 is attached to a counter substrate with the glass layer 135, so that the region for an object to be sealed 132 surrounded by the pair of substrates and the glass layer 135 is provided.

In the glass layer 135, the width of a corner portion is smaller than that of a side portion. A beam diameter of laser light selected in accordance with the width of the side portion allows the glass layer 135 and the counter substrate to be surely welded to each other even in the corner portion (there occurs almost no portion of the glass layer 135 which is not welded to the counter substrate). Therefore, the glass layer 135 and the counter substrate can be welded to each other more surely while suppressing damage of the laser light on an object to be sealed, than in the case where the width of the corner portion is larger than that of the side portion. Accordingly, a sealed structure with high sealing capability can be provided.

Accordingly, application of one embodiment of the present invention can provide a sealed structure achieving both of high sealing capability and a slim border, in which damage of laser light on an object sealed by the sealed structure is suppressed to be provided.

This embodiment can be combined with any other embodiment as appropriate.
(Embodiment 2)

Figure 3A:
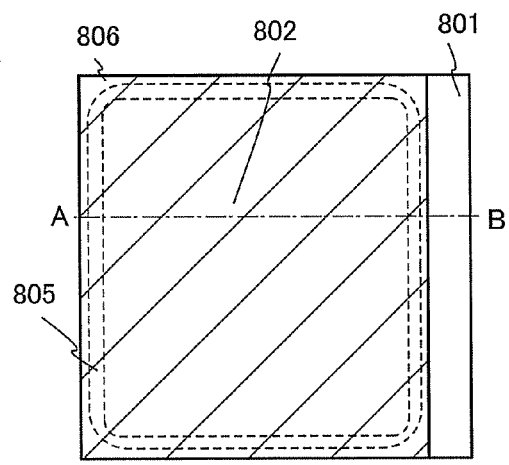
FIGS. 3A to 3C illustrate light-emitting devices of embodiments of the present invention.
Figure 3B:
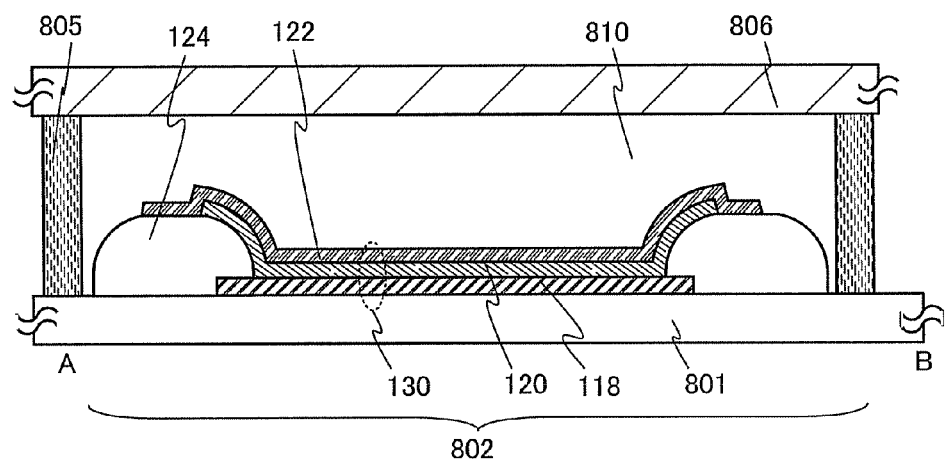
Figure 3C:
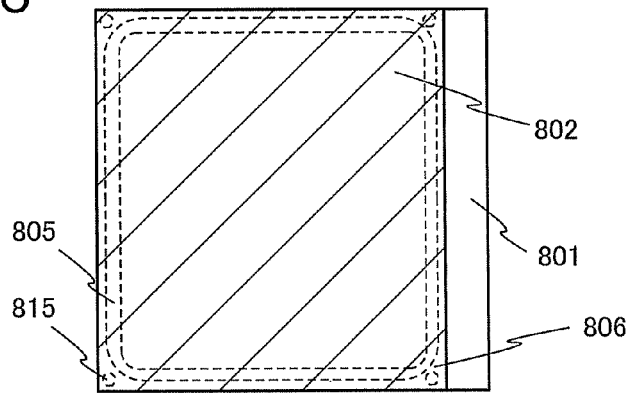

In this embodiment, a light-emitting device of one embodiment of the present invention is described using FIGS. 3A to 3C.

FIG. 3A is a plan view of a light-emitting device of one embodiment of the present invention. FIG. 3B is a cross-sectional view taken along chain line A-B FIG. 3A.

The light-emitting device shown in FIGS. 3A and 3B includes a light-emitting portion 802 provided in a space 810 surrounded by a support substrate 801, a sealing substrate 806, and a glass layer 805.

The glass layer 805 is provided such that its inner contour is along the periphery of a region for an object to be sealed (here, the light-emitting portion 802).

In particular, as for the glass layer 805, the width of a corner portion is smaller than that of a side portion.

The light-emitting portion 802 includes a light-emitting element 130 (including a first electrode 118, an EL layer 120, and a second electrode 122). A bank 124 covers an end portion of the first electrode 118, and is provided with an opening which corresponds to a light-emitting region of the light-emitting element 130.

In the above-described light-emitting device, the pair of substrates is attached to each other with the glass layer 805. Since the sealing capability of glass is high, degradation of the light-emitting element 130 due to moisture, oxygen, or the like can be suppressed, so that the reliability of the light-emitting device is high. Further, since the inner contour of the glass layer 805 is along the periphery of the object to be sealed, a slim border of the light-emitting device can be achieved.

Further, the attachment of the pair of substrates with the glass enables more suppression of spreading of the adhesive out of its predetermined region than the case of using resin. Accordingly, a slim border of the light-emitting device can be achieved.

Further, the glass layer is less likely to be deformed on attachment, and thus the shape of the glass layer 805 after attachment can be predicted before the attachment, which enables suppression of generation of such a defect that the glass layer 805 does not exist in its predetermined region after the attachment and thus an object to be sealed cannot be sealed enough. Accordingly, a light-emitting device which has high reliability and whose border can be slim can be manufactured at high yield.

Further, the glass layer 805 (or glass frit, frit paste, or the like for forming the glass layer 805) can be provided over the substrate, in its desired shape after attachment, which leads to simplification of manufacturing of the light-emitting device.

Further, in the glass layer 805, the width of the corner portion is smaller than that of the side portion. A beam diameter of laser light selected in accordance with the width of the side portion allows the glass layer 805 and the counter substrate to be surely welded to each other even in the corner portion (there occurs almost no portion of the glass layer 805 which is not welded to the counter substrate). Therefore, the glass layer 805 and the counter substrate can be welded to each other more surely while suppressing damage of the laser light on an object to be sealed, than in the case where the width of the corner portion is larger than that of the side portion. Accordingly, a light-emitting device achieving both of high sealing capability and a slim border, in which damage of laser light on the light-emitting element 130 is suppressed to be provided.

Further, the light-emitting element 130 is provided over the support substrate 801 in the light-emitting device described in this embodiment and there is a case where the light-emitting element 130 contains a material whose heat resistance is low. Therefore, also for suppressing deterioration of such an element in the step of pre-baking of frit paste or the like, it is preferable that the glass layer 805 be formed over the sealing substrate 806 in its forming process.

The support substrate 801 and the sealing substrate 806 are in direct contact with the glass layer 805 in this embodiment. However, embodiments of the present invention are not limited thereto; one or both of the substrates may be in indirect contact with the glass layer 805 through a film provided therebetween. Since irradiation with laser light is performed in the manufacturing process, the film provided between the substrate and the glass layer 805 is preferably formed using a high heat-resistant material. For example, an inorganic insulating film formed as a base film or an interlayer insulating film over the substrate may be in direct contact with the glass layer 805.

In the light-emitting device shown in FIG. 3A, there is a space in a corner portion of the sealing substrate 806 outside the glass layer 805. As shown in FIG. 3C, in such a portion which is in the corner portion of the sealing substrate 806 outside the glass layer 805, a resin layer 815 with which the support substrate 801 is attached to the sealing substrate 806 may be provided. In fabricating or using a light-emitting device, force is likely to be more applied to a corner portion of the light-emitting device, and thus a pair of attached substrates of the light-emitting device tends to be detached from each other from the corner portion. Resin, which is highly impact resistant and is less likely to be broken by deformation by external force or the like, enables such a detachment of the pair of attached substrates from each other by force concentrated on the corner portion of the light-emitting device to be suppressed. Therefore, providing the resin layer 815 in the corner portion where the pair of substrate is attached outside the glass layer 805 leads to achievement of a highly reliable light-emitting device.

<Materials that can be Used for Light-Emitting Device of One Embodiment of the Present Invention>

Examples of materials that can be used for the light-emitting device of one embodiment of the present invention are described below. As to the glass layer, refer to the above-described description.

[Support Substrate 801, Sealing Substrate 806]

As materials for the substrates, glass, quartz, an organic resin, or the like can be used. Specifically, a material which has a heat resistance which is high to withstand the process temperature in the manufacturing process of the sealed structure, such as pre-baking or laser light irradiation is used. For the substrate on the side from which light from the light-emitting element is extracted, a material which transmits that light is used.

In order to suppress dispersion of an impurity included in the support substrate 801 into any element provided over the support substrate 801, to provide an insulating layer on the top surface of the support substrate 801 or to perform a heat treatment on the support substrate 801 is preferable.

[Light-Emitting Element 130]

There is no limitation on the method for driving the light-emitting element 130; either an active matrix method or a passive matrix method can be used. Further, any of a top emission structure, a bottom emission structure, and a dual emission structure can be used.

A light-emitting element with a bottom emission structure is used as an example for description in this embodiment.

As examples of a light-transmitting material for the first electrode 118, indium oxide, indium tin oxide (ITO), indium zinc oxide, zinc oxide, zinc oxide to which gallium is added, and the like can be given.

Further, for the first electrode 118, a metal material such as gold, platinum, nickel, tungsten, chromium, molybdenum, iron, cobalt, copper, palladium, or titanium can also be used. A nitride of the metal material (e.g., titanium nitride) or the like may also be used. Graphene or the like may also be used. In the case of using the metal material (or the nitride thereof), the first electrode is preferably formed to be thin so as to be able to transmit light.

The EL layer 120 includes at least a light-emitting layer. The light-emitting layer contains a light-emitting organic compound. The EL layer 120 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate to the above-described light-emitting layer. Examples of the structure of the EL layer are described in detail in Embodiment 5.

The second electrode 122 is provided on the side opposite to the light extraction side and is formed using a reflective material. As the reflective material, a metal material such as aluminum, gold, platinum, silver, nickel, tungsten, chromium, molybdenum, iron, cobalt, copper, or palladium can be used. Any of the following can also be used: an alloy containing aluminum (aluminum alloy) such as an alloy of aluminum and titanium, an alloy of aluminum and nickel, and an alloy of aluminum and neodymium; and an alloy containing silver such as an alloy of silver and copper. The alloy of silver and copper is preferable because of its high heat resistance. Lanthanum, neodymium, or germanium, or the like may be added to the metal material or alloy.

[Bank 124]

As a material for the bank 124, an organic resin or an inorganic insulating material can be used. As the organic resin, for example, a polyimide resin, a polyamide resin, an acrylic resin, a siloxane resin, an epoxy resin, or a phenol resin can be used.

In particular, either a negative photosensitive resin or a positive photosensitive resin is preferably used for easy formation of the bank 124.

The bank 124 is provided so as to cover an end portion of the first electrode 118. The bank 124 is preferably formed to have a curved surface with curvature in its upper end portion or lower end portion in order to improve the coverage with the EL layer 120 or the second electrode 122 which is formed over the bank 124.

There is no particular limitation to the method for forming the bank; a photolithography method, a sputtering method, an evaporation method, a droplet discharging method (e.g., an inkjet method), a printing method (e.g., a screen printing method or an off-set printing method), or the like may be used.

[Space 810]

The space 810 may be filled with an inert gas such as a rare gas or a nitrogen gas or a solid such as an organic resin, or may be in a reduced pressure atmosphere. A dry agent may be provided in the space 810. For the dry agent, a substance which absorbs moisture and the like by chemical adsorption or a substance which adsorbs moisture and the like by physical adsorption can be used. An oxide of an alkali metal, an oxide of an alkaline earth metal (e.g., calcium oxide or barium oxide), sulfate, a metal halide, perchlorate, zeolite, and silica gel can be given as examples thereof.

[Resin Layer 815]

The resin layer 815 can be formed using a known material including a photocurable resin such as an ultraviolet curable resin, a thermosetting resin, or the like; in particular, a material which does not transmit moisture or oxygen is preferably used.

In particular, a photocurable resin is preferably used. The organic EL element contains a material having low heat resistance in some cases. A photocurable resin, which is cured by light irradiation, is preferably used because change in its film quality and deterioration of an organic EL material itself caused by heating of the organic EL element can be suppressed.

This embodiment can be combined with any other embodiment as appropriate.

(Embodiment 3)

Figure 4A:
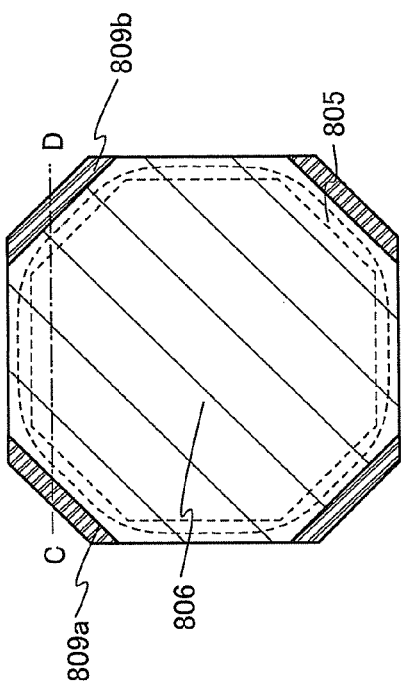
FIGS. 4A and 4B illustrate a light-emitting device of one embodiment of the present invention.
Figure 4B:
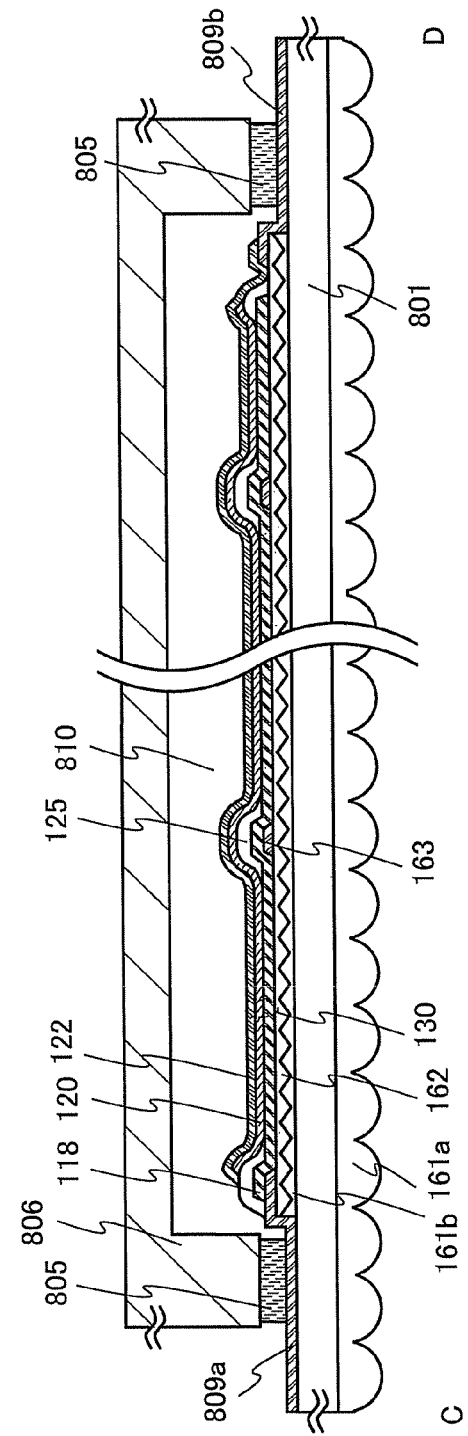

In this embodiment, a light-emitting device of one embodiment of the present invention is described using FIGS. 4A and 4B. FIG. 4A is a plan view of a light-emitting device of one embodiment of the present invention. FIG. 4B is a cross-sectional view taken along chain line C-D FIG. 4A.

In a light-emitting device of this embodiment, a support substrate 801 is attached to a sealing substrate 806 with a glass layer 805.

The glass layer 805 is provided such that its inner contour is along the periphery of an object to be sealed.

In particular, as for the glass layer 805, the width of a corner portion is smaller than that of a side portion. Further, in the corner portion of the glass layer 805, the inner contour has an angle, specifically, an obtuse angle.

In the light-emitting device of this embodiment, a light-emitting element 130 (a first electrode 118, an EL layer 120, and a second electrode 122) is provided in a space 810 surrounded by the support substrate 801, the sealing substrate 806, and the glass layer 805. The light-emitting element 130 has a bottom emission structure; specifically, the first electrode 118 is provided over the support substrate 801, the EL layer 120 is provided over the first electrode 118, and the second electrode 122 is provided over the EL layer 120.

In the above-described light-emitting device, the pair of substrates is attached to each other with the glass layer 805. Since the sealing capability of glass is high, degradation of the light-emitting element 130 due to moisture, oxygen, or the like can be suppressed, so that the reliability of the light-emitting device is high. Further, since the inner contour of the glass layer 805 is along the periphery of the object to be sealed, a slim border of the light-emitting device can be achieved.

Further, the attachment of the pair of substrates with the glass enables more suppression of spreading of the adhesive out of its predetermined region than the case of using resin. Accordingly, a slim border of the light-emitting device can be achieved.

Further, the glass layer 805 is less likely to be deformed on attachment, and thus the shape of the glass layer 805 after attachment can be predicted before the attachment, which enables suppression of generation of such a defect that the glass layer 805 does not exist in its predetermined region after the attachment and thus an object to be sealed cannot be sealed enough. Accordingly, a light-emitting device which has high reliability and whose border can be slim can be manufactured at high yield.

Further, the glass layer 805 (or glass frit, frit paste, or the like for forming the glass layer 805) can be provided over the substrate, in its desired shape after attachment, which leads to simplification of manufacturing of the light-emitting device.

Further, in the glass layer 805, the width of the corner portion is smaller than that of the side portion. A beam diameter of laser light selected in accordance with the width of the side portion allows the glass layer 805 and the counter substrate to be surely welded to each other even in the corner portion (there occurs almost no portion of the glass layer 805 which is not welded to the counter substrate). Therefore, the glass layer 805 and the counter substrate can be welded to each other more surely while suppressing damage of the laser light on an object to be sealed, than in the case where the width of the corner portion is larger than that of the side portion. Accordingly, a light-emitting device achieving both of high sealing capability and a slim border, in which damage of laser light on the light-emitting element 130 is suppressed to be provided.

A first terminal 809a is electrically connected to an auxiliary wiring 163 and the first electrode 118. An insulating layer 125 is provided in a region which overlaps with the auxiliary wiring 163 over the first electrode 118. The first terminal 809a is electrically isolated from the second electrode 122 by the insulating layer 125. A second terminal 809b is electrically connected to the second electrode 122. In this embodiment, the first electrode 118 is formed over the auxiliary wiring 163; however, the auxiliary wiring 163 may be formed over the first electrode 118.

The organic EL element emits light in a region with a refractive index higher than that of the air; thus, when light is extracted to the air, total reflection occurs in the organic EL element or at the interface between the organic EL element and the air under a certain condition, which results in a light extraction efficiency of lower than 100%.

Specifically, supposing that the refractive index of a medium A is higher than the refractive index of a medium B and the refractive index of the medium B is lower than the refractive index of the EL layer, when light enters the medium B from the medium A, total reflection occurs in some cases depending on its incident angle.

In that case, it is preferable that an uneven surface structure be provided at the interface between the medium A and the medium B. With such a structure, such phenomenon that light entering the medium B from the medium A at an incidence angle exceeding a critical angle is totally reflected and the wave of the light propagates inside the light-emitting device to lower the light extraction efficiency can be suppressed.

For example, an uneven surface structure 161a is preferably provided in the interface between the support substrate 801 and the air. The refractive index of the support substrate 801 is higher than the refractive index of the air. Therefore, with the uneven surface structure 161a provided in the interface between the air and the support substrate 801, light which cannot be extracted to the air owing to total reflection can be reduced, whereby the light extraction efficiency of the light-emitting device can be improved.

Further, an uneven surface structure 161b is preferably provided in the interface between the light-emitting element 130 and the support substrate 801.

However, in the organic EL element, unevenness of the first electrode 118 might lead to occurrence of leakage current in the EL layer 120 formed over the first electrode 118. Therefore, in this embodiment, a planarization layer 162 having a refractive index higher than or equal to that of the EL layer 120 is provided in contact with the uneven surface structure 161b. Accordingly, the first electrode 118 can be provided to be a flat film, and thus occurrence of leakage current in the EL layer due to the unevenness of the first electrode 118 can be suppressed. Further, owing to the uneven surface structure 161b in the interface between the planarization layer 162 and the support substrate 801, light which cannot be extracted to the air due to total reflection can be reduced, whereby the light extraction efficiency of the light-emitting device can be increased.

In FIG. 4B, the support substrate 801, the uneven surface structure 161a, and the uneven surface structure 161b are different components; however, embodiments of the present invention are not limited thereto. Two or all of these may be formed as one component.

Although the light-emitting device shown in FIG. 4A is octagonal, embodiments of the present invention are not limited thereto. The shape of the light-emitting device may be any other polygonal or a shape having a curved portion. As the shape of the light-emitting device, a triangle, a quadrangle, a hexagon, or the like is particularly preferable. The reason for this is that a plurality of light-emitting devices can be provided with a redundant space as little as possible in a limited area; a light-emitting device can be formed using a limited substrate area efficiently. Further, the number of light-emitting elements in the light-emitting device is not limited to one; a plurality of light-emitting elements may be provided therein.

<Materials that can be Used for Light-Emitting Device of One Embodiment of the Present Invention>

Examples of materials that can be used for the light-emitting device of one embodiment of the present invention are described below. As for the substrate, the light-emitting element, the sealant, and the space, their respective materials described above in the embodiments can be used.

[Insulating Layer 125]

The insulating layer 125 can be formed using a material similar to any of the materials for the bank 124 described above in the embodiments.

[Auxiliary Wiring 163, First Terminal 809*a*, and Second Terminal 809*b*]

The auxiliary wiring 163, the first terminal 809*a*, and the second terminal 809*b* are preferably formed by the same step(s) (at the same time), because the number of manufacturing steps of the light-emitting device can be reduced. For example, they can be formed to have a single-layer structure or a stacked-layered structure using a material selected from copper (Cu), titanium (Ti), tantalum (Ta), tungsten (W), molybdenum (Mo), chromium (Cr), neodymium (Nd), scandium (Sc), and nickel (Ni) or an alloy material containing any of these materials as its main component.

[Uneven Surface Structure 161*a*, 161*b*]

The shape of the unevenness does not necessarily have an order of regularity. When the shape of the unevenness is periodic, the unevenness functions as a diffraction grating depending on the size of the unevenness, so that an interference effect is increased and light with a certain wavelength is more likely to be extracted to the air. Therefore, it is preferable that the shape of the unevenness be not periodic.

There is no particular limitation on the shape of bottom surface of the unevenness; for example, the shape may be a polygon such a triangle or a quadrangle, a circle, or the like. When the shape of bottom surface of the unevenness has an order of regularity, the unevenness is preferable so that gaps are not formed between adjacent portions of the unevenness. A regular hexagon is given as an example of a preferable shape of the bottom surface.

There is no particular limitation on the cross-sectional shape of bottom surface of the unevenness in the direction perpendicular to the bottom surface; for example, a hemisphere or a shape with a vertex such as a circular cone, a pyramid (e.g., a triangular pyramid or a square pyramid), or an umbrella shape can be used.

In particular, the size or the height of the unevenness is preferably 1 μm or more, because influence of interference of light can be suppressed.

The uneven surface structure 161*a*, 161*b* can be provided directly on/underneath the support substrate 801. As the method therefor, for example, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like can be used as appropriate.

As the material of the uneven surface structure 161*a*, 161*b*, for example, resin can be used; specifically, a polyester resin such as polyethylene terephthalate (PET) or polyethylene naphthalate (PEN), a polyacrylonitrile resin, a polyimide resin, an acrylic (polymethylmethacrylate) resin, a polycarbonate (PC) resin, a polyethersulfone (PES) resin, a polyamide resin, a cyclic olefin-based resin, a cycloolefin resin, a polystyrene resin, a polyamide imide resin, a polyvinylchloride resin, or the like can be used. A resin in which two or more kinds of the above resins are combined may be used. It is preferable to use an acrylic resin because of its high visible light transmittance. A cyclic olefin-based resin and a cycloolefin resin are each preferable because they have high visible light transmittance and high heat resistance.

For the uneven surface structure 161*a*, 161*b*, a hemispherical lens, a micro lens array, a film provided with an uneven surface structure, a light diffusing film, or the like can be used. For example, the lens or film can be attached over/under the support substrate 801 with an adhesive or the like with substantially the same refractive index as the lens or film, so that the uneven surface structure 161*a*, 161*b* can be formed.

[Planarization Layer 162]

The planarization layer 162 is more flat in its one surface which is in contact with the first electrode 118 than in its other surface which is in contact with the uneven surface structure 161*b*. Therefore, the first electrode 118 can be formed to be flat. As a result, generation of leakage current in the EL layer 120 due to unevenness of the first electrode 118 can be suppressed.

As a material of the planarization layer 162, liquid, resin, or the like having a high refractive index can be used. The planarization layer 162 has a light-transmitting property. As examples of the resin having a high refractive index, resin containing bromine, resin containing sulfur, and the like are given; for example, a sulfur-containing polyimide resin, an episulfide resin, a thiourethane resin, a brominated aromatic resin, or the like can be used. Polyethylene terephthalate (PET), triacetyl cellulose (TAC), or the like can also be used. As the liquid having high refractive index, contact liquid (refractive liquid) containing sulfur and methylene iodide, or the like can be used. Any of a variety of methods suitable for the material may be employed for forming the planarization layer 162. For example, the above resin is deposited by a spin coating method and is cured by heat or light. The material and the formation method can be selected as appropriate in consideration of the adhesion strength, ease of processing, or the like.

This embodiment can be combined with any other embodiment as appropriate.

(Embodiment 4)

Figure 5A:
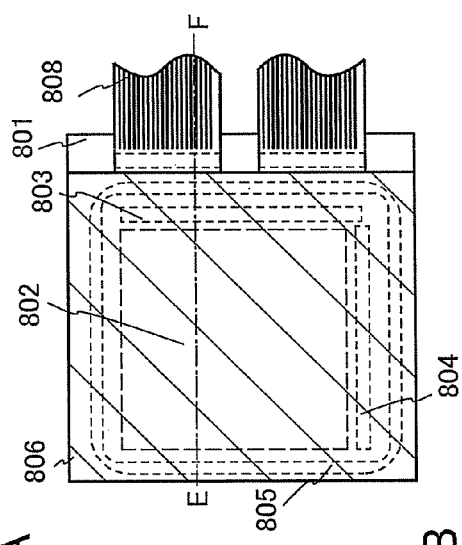
FIGS. 5A and 5B illustrate a light-emitting device of one embodiment of the present invention.
Figure 5B:
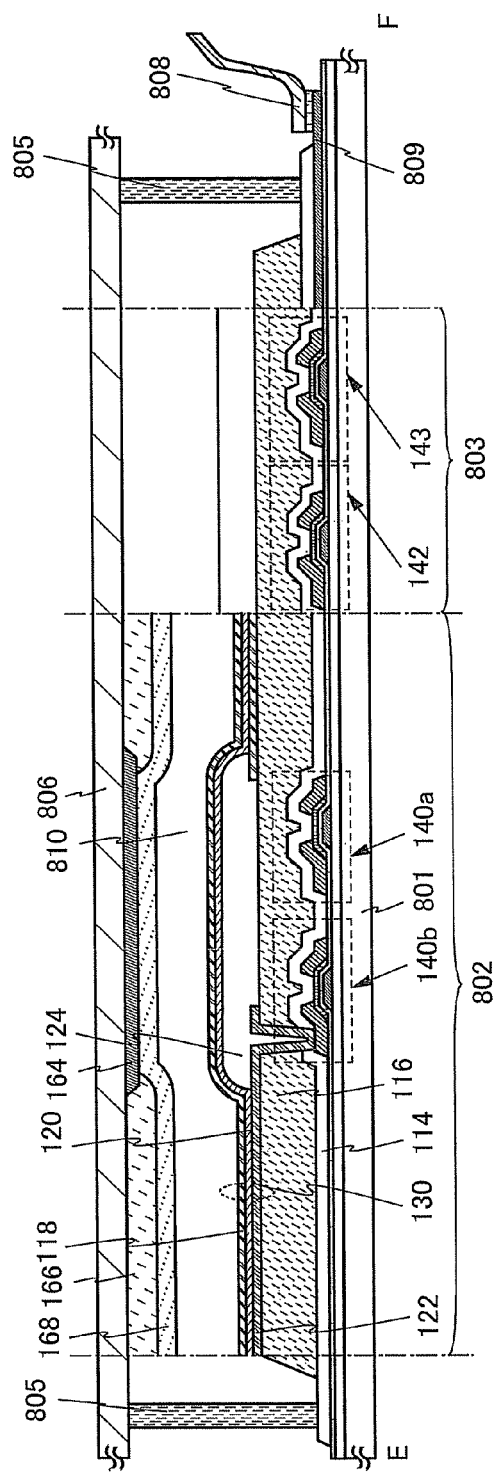

In this embodiment, a light-emitting device of one embodiment of the present invention is described using FIGS. 5A and 5B. FIG. 5A is a plan view of a light-emitting device of one embodiment of the present invention and FIG. 5B is a cross-sectional view taken along chain line E-F in FIG. 5A.

An active matrix light-emitting device according to this embodiment includes, over a support substrate 801, a light-emitting portion 802, a driver circuit portion 803 (gate side driver circuit portion), a driver circuit portion 804 (source side drive circuit portion), and a glass layer 805. The light-emitting portion 802 and the driver circuit portions 803 and 804 are sealed in a space 810 formed by the support substrate 801, a sealing substrate 806, and the glass layer 805.

The glass layer 805 is provided such that its inner contour is along the periphery of a region for an object to be sealed (here, region containing the light-emitting portion 802 and the driver circuit portions 803 and 804)

In particular, as for the glass layer 805, the width of a corner portion is smaller than that of a side portion.

The light-emitting portion 802 shown in FIG. 5B includes a plurality of light-emitting units each including a switching transistor 140*a*, a current control transistor 140*b*, and a second electrode 122 electrically connected to a wiring (a source electrode or a drain electrode) of the transistor 140*b*.

A light-emitting element 130 has a top emission structure, including a first electrode 118, an EL layer 120, and the second electrode 122. Further, a bank 124 is formed to cover an end portion of the second electrode 122.

The sealing capability of the above-described light-emitting device is high because the pair of substrates is attached to each other with the glass layer 805. Further, a slim border of the light-emitting device can be achieved because the glass layer 805 is provided such that its inner contour is along the periphery of the object to be sealed. Further, the glass is less likely to be deformed on attachment, and thus the shape of the glass layer after attachment can be predicted before the attachment, which enables a light-emitting device which has high sealing capability and whose border can be slim to be manufactured at high yield. Further, the glass layer (or glass frit, frit paste, or the like for forming the glass layer) can be provided over the substrate, in its desired shape after attachment, which leads to simplification of manufacturing of the light-emitting device.

Further, in the glass layer 805, the width of the corner portion is smaller than that of the side portion. A beam diameter of laser light selected in accordance with the width of the side portion allows the glass layer 805 and the counter substrate to be surely welded to each other even in the corner portion (there occurs almost no portion of the glass layer 805 which is not welded to the counter substrate). Therefore, the glass layer 805 and the counter substrate can be welded to each other more surely while suppressing damage of the laser light on an object to be sealed, than in the case where the width of the corner portion is larger than that of the side portion. Accordingly, a light-emitting device achieving both of high sealing capability and a slim border, in which damage of laser light on the light-emitting element 130 is suppressed to be provided.

Over the support substrate 801, a lead wiring 809 for connecting an external input terminal through which a signal (e.g., a video signal, a clock signal, a start signal, or a reset signal) or a potential from the outside is transmitted to the driver circuit portion 803, 804 is provided. Here, an example thereof is described in which a flexible printed circuit (FPC) 808 is provided as the external input terminal. A printed wiring board (PWB) may be attached to the FPC 808. In this specification, the light-emitting device includes in its category not only the light-emitting device itself but also the light-emitting device provided with an FPC or a PWB.

The driver circuit portion 803, 804 includes a plurality of transistors. An example in which the driver circuit portion 803 includes a CMOS circuit which is a combination of an n-channel transistor 142 and a p-channel transistor 143 is shown in FIG. 5B. A circuit included in the driver circuit portion can be formed using any type of circuit such as a CMOS circuit, a PMOS circuit, or an NMOS circuit. In this embodiment, a driver-integrated type in which a driver circuit and a light-emitting portion are formed over the same substrate is described; however, embodiments of the present invention are not limited to this structure, in which a driver circuit can be formed over a substrate that is different from a substrate over which a light-emitting portion is formed.

To prevent increase in the number of manufacturing steps, the lead wiring 809 is preferably formed using the same material and the same step(s) as those of the electrode or the wiring in the light-emitting portion or the driver circuit portion.

Described in this embodiment is an example in which the lead wiring 809 is formed using the same material and the same step(s) as those of the gate electrode of the transistor included in the light-emitting portion 802 and the driver circuit portion 803.

In FIG. 5B, the glass layer 805 is in contact with a first insulating layer 114 over the lead wiring 809. The adhesion of the glass layer 805 to metal is low in some cases. Therefore, the glass layer 805 is preferably in contact with an inorganic insulating film over the lead wiring 809; such a structure enables a light-emitting device with high sealing capability and high reliability to be achieved. As examples of the inorganic insulating film, an oxide film of a metal or a semiconductor, a nitride film of a metal or a semiconductor, and an oxynitride film of a metal or a semiconductor are given; specifically, a silicon oxide film, a silicon nitride film, a silicon oxynitride film, a silicon nitride oxide film, an aluminum oxide film, a titanium oxide film, and the like can be given.

<Materials that can be Used for Light-Emitting Device of One Embodiment of the Present Invention>

Examples of materials that can be used for the light-emitting device of one embodiment of the present invention are described below. As for the substrate, the light-emitting element, the glass layer, the space, and the bank, their respective materials described above in the embodiments can be used.

[Transistor]

There is no particular limitation on the structure of the transistor (e.g., the transistor 140*a*, 140*b*, 142, or 143) used in the light-emitting device of one embodiment of the present invention. A top-gate transistor may be used, or a bottom-gate transistor such as an inverted staggered transistor may be used. A channel-etched type or a channel-stop (channel-protective) type may also be employed. In addition, there is no particular limitation on materials for the transistor.

The gate electrode can be formed to have a single-layer structure or a stacked-layer structure using any of metal materials such as molybdenum, titanium, chromium, tantalum, tungsten, aluminum, copper, neodymium, and scandium, or an alloy material which contains any of these elements, for example. A structure may be employed in which a film of a high-melting-point metal such as titanium, molybdenum, or tungsten, or a nitride film of any of these metals (a titanium nitride film, a molybdenum nitride film, or a tungsten nitride film) is stacked either or both of over and under a metal film of aluminum, copper, or the like. For example, a three layer structure consisting of a titanium film, an aluminum film or a copper film, and a titanium film is preferably employed.

The gate insulating layer is formed using a material which transmits light from the light-emitting element. The gate insulating layer can be formed to have a single-layer structure or a stacked-layer structure using any of silicon oxide, silicon nitride, silicon oxynitride, silicon nitride oxide, and aluminum oxide by a plasma-enhanced CVD method, a sputtering method, or the like, for example.

The semiconductor layer can be formed using a silicon semiconductor or an oxide semiconductor. As examples of the silicon semiconductor, single crystal silicon, polycrystalline silicon, and the like can be given. As the oxide semiconductor, an In—Ga—Zn—O-based metal oxide or the like can be used as appropriate. The semiconductor layer is preferably formed using an In—Ga—Zn—O-based metal oxide that is an oxide semiconductor such that the semiconductor layer is a semiconductor layer whose off-state current is small, because the off-state leakage current of the light-emitting element 130 can be reduced.

As the source electrode layer and the drain electrode layer, for example, a metal film containing an element selected from aluminum, chromium, copper, tantalum, titanium, molybdenum, and tungsten; a metal nitride film containing any of the above elements (e.g., a titanium nitride film, a molybdenum nitride film, or a tungsten nitride film); or the like can be used. A structure may also be used in which a film of a high-melting-point metal such as titanium, molybdenum, or tungsten, or a nitride film of any of these metals (a titanium nitride film, a molybdenum nitride film, or a tungsten nitride film) is stacked either or both of over and under a metal film of aluminum, copper, or the like. For example, a three-layer structure consisting of a titanium film, an aluminum film or a copper film, and a titanium film is preferably used.

Further or alternatively, the source electrode layer and the drain electrode layer may be formed using a conductive metal oxide. As the conductive metal oxide, indium oxide ($In_2O_3$ or the like), tin oxide ($SnO_2$ or the like), zinc oxide (ZnO), ITO, indium oxide-zinc oxide ($In_2O_3$—ZnO or the like), or any of these metal oxide materials in which silicon oxide is contained can be used.

[First Insulating Layer 114, Second Insulating Layer 116]

The first insulating layer 114 and a second insulating layer 116 are formed using materials which transmit light from the light-emitting element.

The first insulating layer 114 has an effect of preventing diffusion of impurities into the semiconductor included in the transistor. As the first insulating layer 114, an inorganic insulating film such as a silicon oxide film, a silicon oxynitride film, or an aluminum oxide film can be used.

As the second insulating layer 116, an insulating film with a planarization function is preferably selected in order to reduce surface unevenness due to a color filter or the transistor. For example, an organic material such as a polyimide resin, an acrylic resin, or a benzocyclobutene resin can be used. Other than such organic materials, it is also possible to use a low-dielectric constant material (a low-k material) or the like. The second insulating layer 116 may be formed by stacking a plurality of insulating films formed using any of these materials.

[Color Filter 166, Black Matrix 164]

For the sealing substrate 806, a color filter 166 that is a coloring layer is provided to overlap with (the light-emitting region of) the light-emitting element 130. The color filter 166 is provided in order to control the color of light emitted from the light-emitting element 130. For example, in a full-color display device using white light-emitting elements, a plurality of light-emitting units provided with color filters of different colors are used. In that case, three colors, red (R), green (G), and blue (B), may be used, or four colors, red (R), green (G), blue (B), and yellow (Y), may be used.

Further, a black matrix 164 is provided between the adjacent color filters 166 (not to overlap with the light-emitting region of the light-emitting element 130). The black matrix 164 shields the light-emitting unit from light emitted from the light-emitting element 130 in its adjacent light-emitting unit and thereby prevents color mixture between the adjacent light-emitting units. Here, the color filter 166 is provided so that its end portion overlaps with the black matrix 164, whereby light leakage can be suppressed. The black matrix 164 can be formed using a material which shields light emitted from the light-emitting element 130, for example, metal or an organic resin. The black matrix 164 may be provided in a region other than the light-emitting portion 802, such as the driver circuit portion 803.

Further, an overcoat layer 168 is formed to cover the color filter 166 and the black matrix 164. The overcoat layer 168 is formed using a material which transmits light emitted from the light-emitting element 130; for example, an inorganic insulating film or an organic insulating film can be used. The overcoat layer 168 is not necessarily provided unless needed.

In this embodiment, a light-emitting device using a color filter method is described as an example; however, embodiments of the present invention are not limited thereto. For example, a separate coloring method or a color conversion method may be used.

This embodiment can be combined with any other embodiment as appropriate.

(Embodiment 5)

Figure 6A:
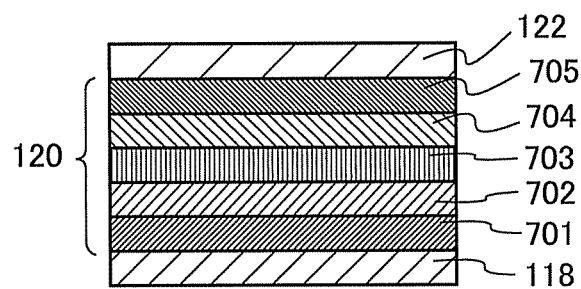
FIGS. 6A to 6C illustrate EL layers.
Figure 6B:
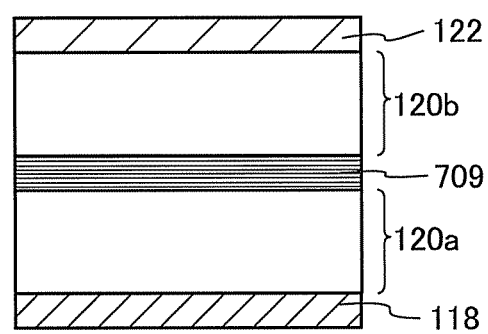
Figure 6C:
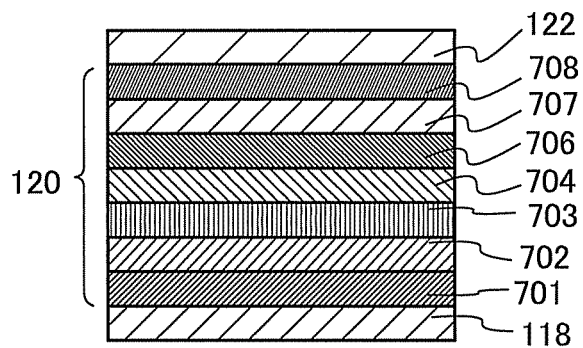

In this embodiment, structural examples of an EL layer applicable to a light-emitting device of one embodiment of the present invention are described using FIGS. 6A to 6C.

A known substance can be used for the EL layer; either a low molecular compound or a high molecular compound can be used. The constituent substance of the EL layer is not limited to an organic compound; an inorganic compound may be contained.

In FIG. 6A, an EL layer 120 is provided between a first electrode 118 and a second electrode 122. In the EL layer 120 in FIG. 6A, a hole-injection layer 701, a hole-transport layer 702, a light-emitting layer 703, an electron-transport layer 704, and an electron-injection layer 705 are stacked in this order from the first electrode 118 side.

A plurality of EL layers may be stacked between the first electrode 118 and the second electrode 122 as shown in FIG. 6B. In that case, a charge generation layer 709 is preferably provided between a first EL layer 120a and a second EL layer 120b which are stacked. In a light-emitting element having such a structure, problems such as energy transfer and quenching less occur, which enables expansion in the choice of materials, thereby achieving a light-emitting element which has both high light emission efficiency and long lifetime easily. Moreover, phosphorescence and fluorescence can be obtained easily from one EL layer and the other EL layer, respectively. This structure can be combined with the above-described EL layer structure.

Further, by forming EL layers to emit light of different colors from each other, a light-emitting element can provide light emission of a desired color as a whole. For example, by forming a light-emitting element having two EL layers such that the emission color of the first EL layer and the emission color of the second EL layer are colors complementary to each other, the light-emitting element can provide white light emission as a whole. The "colors complementary to each other" means colors which become an achromatic color by mixture of them. That is, once respective light emitted from substances whose emission colors are complementary to each other is mixed together, white emission color can be obtained. This applies to a light-emitting element having three or more EL layers.

As shown in FIG. 6C, the EL layer 120 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 122, between the first electrode 118 and the second electrode 122.

It is preferable to provide the composite material layer 708 which is in contact with the second electrode 122, because damage on the EL layer 120 particularly in formation of the second electrode 122 by a sputtering method can be attenuated.

Further, by the electron-injection buffer layer 706, an injection barrier between the composite material layer 708 and the electron-transport layer 704 can be reduced; thus, electrons generated in the composite material layer 708 can be easily injected to the electron-transport layer 704.

Furthermore, the electron-relay layer 707 is preferably formed between the electron-injection buffer layer 706 and the composite material layer 708. The electron-relay layer 707 is not necessarily provided; however, the electron-relay layer 707 having a high electron-transport property enables electrons to be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in drive voltage can be suppressed.

Examples of respective materials which can be used for the layers are described below. Each layer is not limited to a single layer, but may be a stack of two or more layers.

<Hole-Injection Layer 701>

The hole-injection layer 701 is a layer containing a substance having a high hole-injection property.

As the substance having a high hole-injection property, for example, a metal oxide such as molybdenum oxide, vanadium oxide, ruthenium oxide, tungsten oxide, or manganese oxide, a phthalocyanine-based compound such as phthalocyanine ($H_2Pc$) and copper(II) phthalocyanine (CuPc), or the like can be used.

Further, a high molecular compound such as poly(N-vinylcarbazole) (abbreviation: PVK) or poly(4-vinyltriphenylamine) (abbreviation: PVTPA), or a high molecular compound to which acid is added, such as poly(3,4-ethylenedioxythiophene)/poly(styrenesulfonic acid) (PEDOT/PSS) can also be used.

In particular, for the hole-injection layer 701, a composite material containing an organic compound having a high hole-injection property and an electron acceptor (acceptor) is preferably used. Such a composite material has an excellent hole-injection and hole-transport properties because holes are generated in the organic compound by the electron acceptor. Such a composite material enables the hole-transport capability from the first electrode to the EL layer to be increased, whereby the drive voltage of the light-emitting element can be decreased.

Such a composite material can be formed by co-evaporation of an organic compound having a high hole-transport property and an electron acceptor. The hole-injection layer 701 is not limited to a structure in which an organic compound having a high hole-transport property and an electron acceptor are contained in the same film, but may be a structure in which a layer containing an organic compound having a high hole-transport property and a layer containing an electron acceptor may be stacked. Specifically, a layer containing an electron acceptor is in contact with the first electrode 118.

The organic compound used in the composite material is an organic compound whose hole-transport property is higher than its electron-transport property; particularly, it is preferable that the hole mobility of the organic compound be greater than or equal to $10^{-6}$ cm$^2$/Vs. As the organic compound for the composite material, any of a variety of compounds including an aromatic amine compound, a carbazole derivative, an aromatic hydrocarbon compound, and a high molecular compound can be used.

As examples of the aromatic amine compound, 4,4'-bis[N-(1-naphthyl)-N-phenylamino]biphenyl (abbreviation: NPB or α-NPD), 4-phenyl-4'-(9-phenylfluoren-9-yl)triphenylamine (abbreviation: BPAFLP), and the like can be given.

As examples of the carbazole derivative, 4,4'-di(N-carbazolyl)biphenyl (abbreviation: CBP), 9-[4-(10-phenyl-9-anthracenyl)phenyl]-9H-carbazole (abbreviation: CzPA), 9-phenyl-3-[4-(10-phenyl-9-anthryl)phenyl]-9H-carbazole (abbreviation: PCzPA), and the like can be given.

As examples of the aromatic hydrocarbon compound, 2-tert-butyl-9,10-di(2-naphthyl)anthracene (abbreviation: t-BuDNA), 9,10-di(2-naphthyl)anthracene (abbreviation: DNA), 9,10-diphenylanthracene (abbreviation: DPAnth), and the like can be given.

As examples of the high molecular compound, PVK, PVTPA, and the like can be given.

As examples of the electron acceptor for the composite material, a transition metal oxide or an oxide of a metal belonging to Group 4 to Group 8 of the periodic table can be given. Specifically, molybdenum oxide is preferable. Molybdenum oxide is easy to handle because of its stability in the air and its low hygroscopic property.

<Hole-Transport Layer 702>

The hole-transport layer 702 is a layer which contains a substance having a high hole-transport property.

The substance having a high hole-transport property is a substance whose hole-transport property is higher than its electron-transport property; particularly, it is preferable that the hole mobility of the substance having a high hole-transport property be greater than or equal to $10^{-6}$ cm$^2$/Vs. For example, any of a variety of compounds such as an aromatic amine compound such as NPB or BPAFLP, a carbazole derivative such as CBP, CzPA, or PCzPA, an aromatic hydrocarbon compound such as t-BuDNA, DNA, or DPAnth, and a high molecular compound such as PVK or PVTPA can be used.

<Light-Emitting Layer 703>

For the light-emitting layer 703, a fluorescent compound that exhibits fluorescence or a phosphorescent compound that exhibits phosphorescence can be used.

As examples of the fluorescent compound for the light-emitting layer 703, N,N'-bis[4-(9H-carbazol-9-yl)phenyl]-N,N'-diphenylstilbene-4,4'-diamine (abbreviation: YGA2S), N-(9,10-diphenyl-2-anthryl)-N,9-diphenyl-9H-carbazol-3-amine (abbreviation: 2PCAPA), rubrene, and the like can be given.

As examples of the phosphorescent compound for the light-emitting layer 703, metallo-organic complexes such as bis[2-(4',6'-difluorophenyl)pyridinato-N,C$^{2'}$]iridium(III)picolinate (abbreviation: FIrpic), tris(2-phenylpyridinato-N,C$^{2'}$)iridium(III) (abbreviation: Ir(ppy)$_3$), and (acetylacetonato)bis(3,5-dimethyl-2-phenylpyrazinato)iridium(III) (abbreviation: Ir(mppr-Me)$_2$(acac)) can be given.

The light-emitting layer 703 may have a structure in which any of the above-described light-emitting organic compounds (a light-emitting substance or a guest material) is dispersed in another substance (a host material). As the host material, any of a variety of materials can be used, and it is preferable to use a substance which has a lowest unoccupied molecular orbital level (LUMO level) higher than that of the guest material and has a highest occupied molecular orbital level (HOMO level) lower than that of the guest material.

With a structure in which a guest material is dispersed in a host material, crystallization of the light-emitting layer 703 can be suppressed. Further, concentration quenching due to high concentration of the guest material can be suppressed.

As the host material, specifically, a metal complex such as tris(8-quinolinolato)aluminum(III) (abbreviation: Alq) or bis(2-methyl-8-quinolinolato) (4-phenylphenolato)aluminum (III) (abbreviation: BAlq), a heterocyclic compound such as 3-(4-butylphenyl)-4-phenyl-5-(4-tert-butylphenyl)-1,2,4-triazole (abbreviation: TAZ), bathophenanthroline (abbreviation: BPhen), or bathocuproine (abbreviation: BCP), a condensed aromatic compound such as CzPA, DNA, t-BuDNA, or DPAnth, an aromatic amine compound such as NPB, or the like can be used.

Plural kinds of materials can be used for the host material. For example, to suppress crystallization, a substance such as rubrene which suppresses crystallization, may be further added. In addition, NPB, Alq, or the like may be further added in order to efficiently transfer energy to the guest material.

Further, by providing a plurality of light-emitting layers such that their respective emission colors are different from each other, light emission of a desired color can be obtained from the light-emitting element as a whole. For example, by using first and second light-emitting layers whose emission colors are complementary to each other in a light-emitting element having the two light-emitting layers, the light-emitting element can be made to emit white light as a whole. The same applies to a light-emitting element having three or more light-emitting layers.

<Electron-Transport Layer 704>

The electron-transport layer 704 is a layer which contains a substance having a high electron-transport property.

The substance having a high electron-transport property is an organic compound whose electron-transport property is higher than its hole-transport property; particularly, it is preferable that the electron mobility of the substance having a high electron-transport property be greater than or equal to $10^{-6}$ cm$^2$/Vs.

As the substance having a high electron-transport property, a metal complex having a quinoline skeleton or a benzoquinoline skeleton, such as Alq or BAlq, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$), or the like can be used. Further, TAZ, BPhen, BCP, or the like can also be used.

<Electron-Injection Layer 705>

The electron-injection layer 705 is a layer which contains a substance having a high electron-injection property.

As the substance having a high electron-injection property, an alkali metal such as lithium, an alkaline earth metal such as cesium or calcium, or a compound thereof such as lithium fluoride, cesium fluoride, calcium fluoride, or lithium oxide can be used. Further, a rare earth metal compound such as erbium fluoride can also be used. Any of the above-described substances for the electron-transport layer 704 can also be used.

The hole-injection layer 701, the hole-transport layer 702, the light-emitting layer 703, the electron-transport layer 704, and the electron-injection layer 705 which are described above can each be formed by an evaporation method (e.g., a vacuum evaporation method), an ink-jet method, a coating method, or the like.

<Charge Generation Layer 709>

The charge generation layer 709 shown in FIG. 6B can be formed using the above-described composite material. The charge generation layer 709 may have a stacked-layer structure including a layer containing the composite material and a layer containing another material. In that case, as the layer containing another material, a layer containing an electron donating substance and a substance having a high electron-transport property, a layer formed of a transparent conductive film, or the like can be used.

<Composite Material Layer 708>

For the composite material layer 708 shown in FIG. 6C, the above-described composite material containing an organic compound having a high hole-transport property and an electron acceptor can be used.

<Electron-Injection Buffer Layer 706>

For the electron-injection buffer layer 706, a substance having a high electron-injection property, such as an alkali metal, an alkaline earth metal, a rare earth metal, or a compound of any of the above metals (including an oxide such as lithium oxide, a halide, and a carbonate such as lithium carbonate or cesium carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. As the donor substance, an organic compound such as tetrathianaphthacene (abbreviation: TTN), nickelocene, or decamethylnickelocene can be used as well as an alkali metal, an alkaline earth metal, a rare earth metal, or a compound of any of the above metals. As the substance having a high electron-injection property, a material similar to any of the above-described materials for the electron-transport layer 704 can be used.

<Electron-Relay Layer 707>

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is adjusted so as to be located between the LUMO level of the acceptor material contained in the composite material layer 708 and the LUMO level of the substance having a high electron-transport property contained in the electron-transport layer 704. As for the specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As examples of the phthalocyanine-based material for the electron-relay layer 707, specifically, CuPc, PhO-VOPc (Vanadyl 2,9,16,23-tetraphenoxy-29H,31H-phthalocyanine), and the like can be given.

As the metal complex having a metal-oxygen bond and an aromatic ligand for the electron-relay layer 707, a metal complex having a metal-oxygen double bond is preferably used. The metal-oxygen double bond has an acceptor property (properties of high electron acceptability), which facilitate transfer (donation and acceptance) of electrons.

As the metal complex having a metal-oxygen bond and an aromatic ligand, a phthalocyanine-based material is preferable. In particular, a material in which a metal-oxygen double bond is more likely to act on another molecular in terms of a molecular structure and having a high acceptor property is preferable.

As the phthalocyanine-based material, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent, and thus has a merit of easy handling for formation of a light-emitting element. In addition, the phthalocyanine derivative having a phenoxy group, which is soluble in a solvent, also has a merit of easy maintenance of an apparatus for forming its film.

The electron-relay layer 707 may contain a donor substance. As examples of the donor substance, materials similar to the donor materials for the electron-injection buffer layer 706 can be given. The donor substance contained in the electron-relay layer 707 facilitates electron transfer, enabling the drive voltage of the light-emitting element to be decreased.

In the case where the donor substance is contained in the electron-relay layer 707, as for the substance having a high electron-transport property, a substance having a LUMO level higher than the acceptor level of the acceptor substance contained in the composite material layer 708 can be used as well as the materials described above. As for the specific energy level, the LUMO level is preferably greater than or equal to −5.0 eV, more preferably greater than or equal to −5.0 eV and less than or equal to −3.0 eV. As examples of such a material, a perylene derivative such as 3,4,9,10-perylenetetracarboxylic dianhydride (abbreviation: PTCDA), a nitrogen-containing condensed aromatic compound such as pirazino[2,3-f][1,10]phenanthroline-2,3-dicarbonitrile (abbreviation: PPDN), and the like can be given. The nitrogen-containing condensed aromatic compound is preferable for the electron-relay layer 707 because of its stability.

Through the above, the EL layer of this embodiment can be formed.

This embodiment can be combined with any other embodiment as appropriate.

(Embodiment 6)

In this embodiment, using FIGS. 7A to 7E, FIG. 8, and FIGS. 9A to 9C, description is given of examples of a variety of electronic devices and lighting devices to each of which a light-emitting device of one embodiment of the present invention can be applied.

The light-emitting device of one embodiment of the present invention has high reliability and the border thereof can be slim. Thus, an electronic device and a lighting device each of which has high reliability and whose, border can be slim can be achieved by application of the light-emitting device of one embodiment of the present invention.

Examples of the electronic devices to which the light-emitting device is applied are television devices (also referred to as TV or television receivers), monitors for computers and the like, cameras such as digital cameras and digital video cameras, digital photo frames, mobile phones (also referred to as portable telephone devices), portable game machines, portable information terminals, audio playback devices, large game machines such as pin-ball machines, and the like. Specific examples of these electronic devices and the lighting device are illustrated in FIGS. 7A to 7E, FIG. 8, and FIGS. 9A to 9C.

Figure 7A:
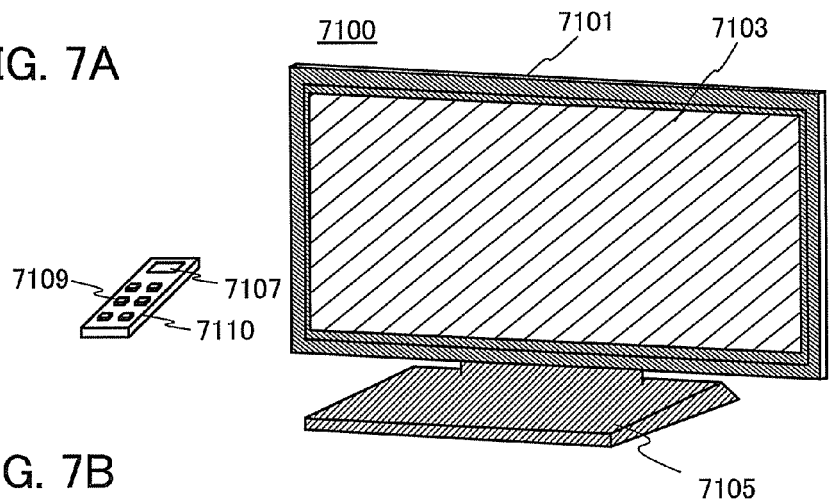
FIGS. 7A to 7E illustrate electronic devices and a lighting device of embodiments of the present invention.

FIG. 7A illustrates an example of a television device. In a television device 7100, a display portion 7103 is incorporated in a housing 7101. Images can be displayed on the display portion 7103 to which the light-emitting device of one embodiment of the present invention can be applied. Application of the light-emitting device of one embodiment of the present invention to the display portion 7103 enables achievement of a television device having high reliability and a slim border. In FIG. 7A, the housing 7101 is supported by a stand 7105.

The television device 7100 can be operated by an operation switch of the housing 7101 or a separate remote controller 7110. With operation keys 7109 of the remote controller 7110, channels and volume can be controlled to control images displayed on the display portion 7103. The remote controller 7110 may be provided with a display portion 7107 on which data output from the remote controller 7110 is displayed.

The television device 7100 is provided with a receiver, a modem, or the like. With the receiver, a general television broadcast can be received. Furthermore, the television device 7100 can be connected to a communication network by wired or wireless connection via the modem, which enables one-way (from a transmitter to a receiver) or two-way (between a transmitter and a receiver, between receivers, or the like) data communication.

Figure 7B:
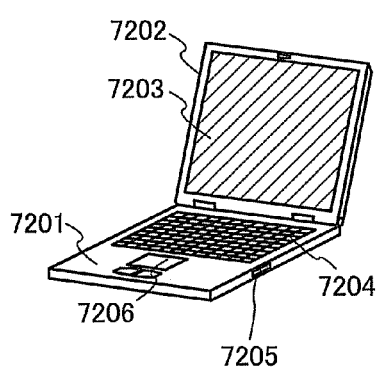

FIG. 7B illustrates a computer, which includes a main body 7201, a bezel 7202, a display portion 7203, a keyboard 7204, an external connection port 7205, a pointing device 7206, and the like. The light-emitting device of one embodiment of the present invention is applied to the display portion 7203 in this computer. Application of the light-emitting device of one embodiment of the present invention to the display portion 7203 enables achievement of a computer having high reliability and a slim border.

Figure 7C:
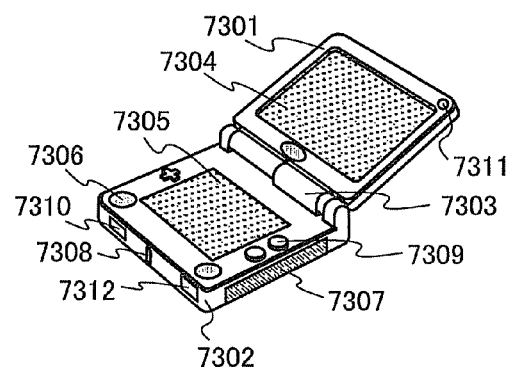

FIG. 7C illustrates a portable game machine, which includes two housings, a housing 7301 and a housing 7302, which are connected with a joint portion 7303 so that the portable game machine can be opened and folded. A display portion 7304 is incorporated in the housing 7301 and a display portion 7305 is incorporated in the housing 7302. In addition, the portable game machine illustrated in FIG. 7C has a speaker portion 7306, a recording medium insertion portion 7307, an LED lamp 7308, an input means (an operation key 7309, a connection terminal 7310, a sensor 7311 (a sensor of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device of one embodiment of the present invention is used for at least either one or both of the display portion 7304 and the display portion 7305, and can have any other accessory as appropriate. Application of the light-emitting device of one embodiment of the present invention to the display portion 7304 and/or the display portion 7305 enables achievement of a highly reliable portable game machine whose border is slim. The portable game machine illustrated in FIG. 7C has a function of reading out a program or data stored in a storage medium to display it on the display portion, or a function of sharing information with another portable game machine by wireless communication. The portable game machine illustrated in FIG. 7C can have a variety of functions without limitation to the above.

Figure 7D:
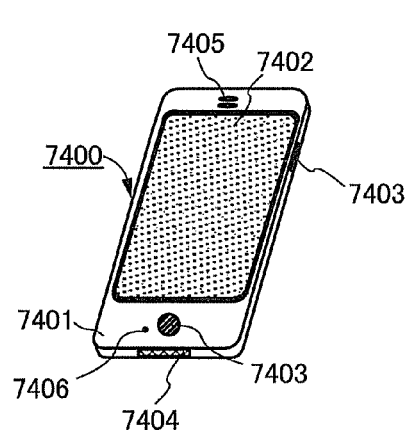

FIG. 7D illustrates an example of a mobile phone. A mobile phone 7400 has a display portion 7402 incorporated in a housing 7401, operation buttons 7403, an external connection port 7404, a speaker 7405, a microphone 7406, and the like. The light-emitting device of one embodiment of the present invention is applied to the display portion 7402 in the mobile phone 7400. Application of the light-emitting device of one embodiment of the present invention to the display portion 7402 enables achievement of a highly reliable mobile phone whose border is slim.

Through a touch on the display portion 7402 of the mobile phone 7400 illustrated in FIG. 7D with a finger or the like, data can be input into the mobile phone 7400. Further, operations such as making a call and creating e-mail can be performed by a touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating an e-mail, the text input mode mainly for inputting text is selected for the display portion 7402 so that text displayed on its screen can be input. In this case, it is preferable to display a keyboard or number buttons on almost the entire screen of the display portion 7402.

Further, a detection device including a sensor for detecting inclination, such as a gyroscope or an acceleration sensor, is provided inside the mobile phone 7400, with which display on the screen of the display portion 7402 can be automatically changed in response to the determined orientation of the mobile phone 7400 (whether the mobile phone is placed horizontally or vertically for a landscape mode or a portrait mode).

The screen mode is switched by touching the display portion 7402 or operating the operation button 7403 of the housing 7401. The screen mode can also be switched depending on the kind of image displayed on the display portion 7402. For example, when the signal of an image displayed on the display portion is a signal of moving image data, the screen mode is switched to the display mode, whereas when the signal is a signal of text data, the screen mode is switched to the input mode.

Moreover, in the input mode, a signal detected by an optical sensor in the display portion 7402 can be detected, whereby the screen mode may be controlled so as to be switched from the input mode to the display mode in the case where input by touching the display portion 7402 is not performed for a specified period.

The display portion 7402 may function as an image sensor. For example, an image of a palm print, a fingerprint, or the like is taken by touch on the display portion 7402 with the palm or finger, whereby personal authentication can be performed. Further, by using a backlight or a sensing light source which emits a near-infrared light in the display portion, an image of a finger vein, a palm vein, or the like can be taken.

Figure 7E:
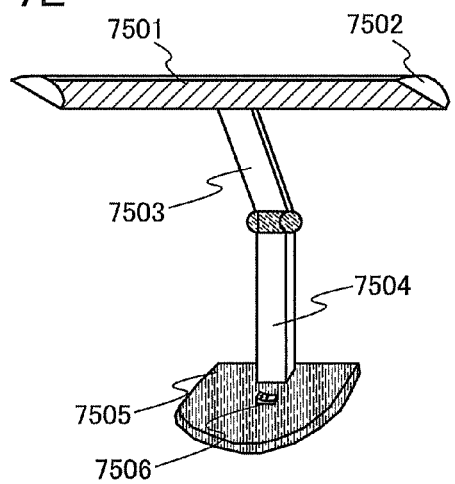

FIG. 7E illustrates a desk lamp including a lighting portion 7501, a shade 7502, an adjustable arm 7503, a support 7504, a base 7505, and a power supply 7506. The light-emitting device of one embodiment of the present invention is applied to the lighting portion 7501 of the desk lamp. Application of the light-emitting device of one embodiment of the present invention to the lighting portion 7501 enables achievement of a highly reliable desk lamp whose border is slim. The lamp includes a ceiling light, a wall light, and the like in its category.

Figure 8:
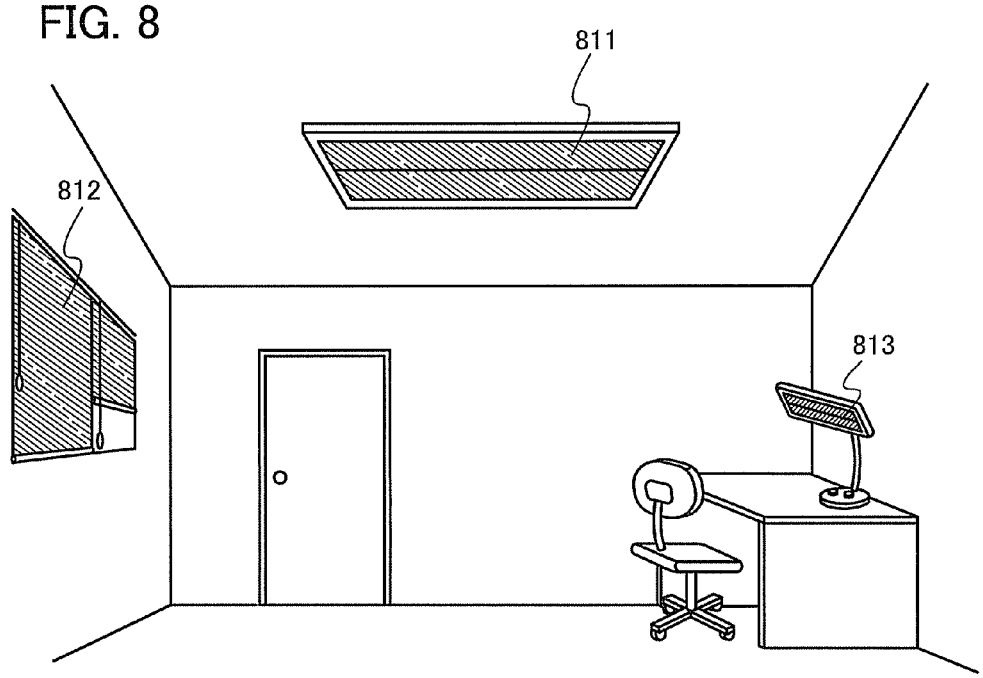
FIG. 8 illustrates lighting devices of embodiments of the present invention.

FIG. 8 illustrates an example in which the light-emitting device of one embodiment of the present invention is applied to an indoor lighting device 811. The area of the light-emitting device of one embodiment of the present invention can be scaled up and the reliability and border of the light-emitting device of one embodiment of the present invention are high and slim, respectively, which enables application to a large-area lighting device. Furthermore, the light-emitting device can be used as a roll-type lighting device 812. As illustrated in FIG. 8, a desk lamp 813, which is described in FIG. 7E, may also be used in a room provided with the interior lighting device 811.

Figure 9A:
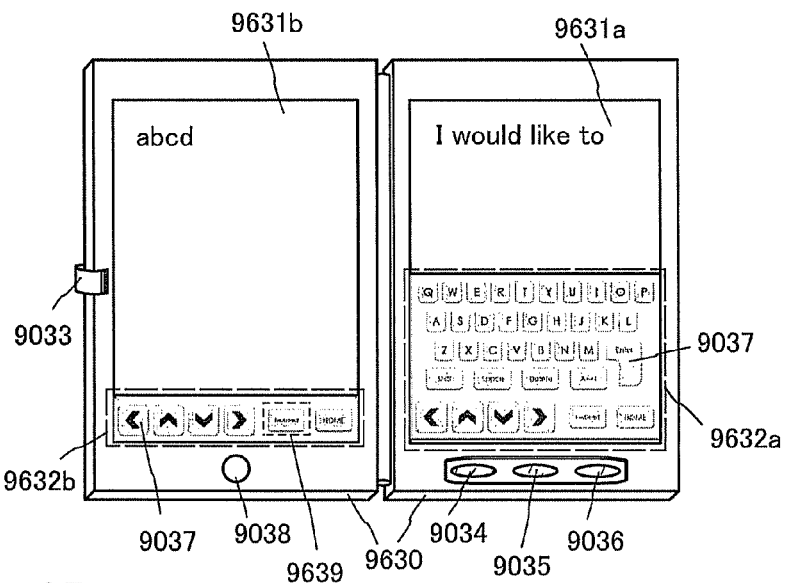
FIGS. 9A to 9C illustrate an electronic device of one embodiment of the present invention.
Figure 9B:
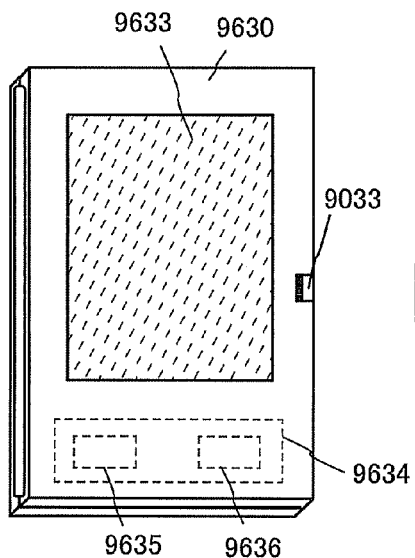

FIGS. 9A and 9B illustrate a foldable tablet terminal. In FIG. 9A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

Part of the display portion 9631a can form a touch panel region 9632a, in which data can be input by touching operation keys 9037 which are displayed. Although a structure in which a half region in the display portion 9631a has only a display function and the other half region has a touch panel function is shown as an example in FIG. 9A, the display portion 9631a is not limited to this structure. The entire area of the display portion 9631a may have a touch panel function. For example, keyboard buttons are displayed on the entire screen of the display portion 9631a such that the entire screen of the display portion 9631a functions as a touch panel, whereas the display portion 9631b can be used as a display screen.

Like the display portion 9631a, part of the display portion 9631b can form a touch panel region 9632b. Further, a switching button 9639 for showing/hiding a keyboard of the touch panel can be touched with a finger, a stylus, or the like, so that keyboard buttons can be displayed on the display portion 9631b.

Touch input can be performed concurrently on the touch panel regions 9632a and 9632b.

The display-mode switching button 9034 can switch the display orientation (e.g., between landscape mode and portrait mode) and select a display mode (switch between monochrome display and color display), for example. With the power-saving-mode switching button 9036, the luminance of display can be optimized in accordance with the amount of external light when the tablet is in use, which is detected with an optical sensor incorporated in the tablet. The tablet may include any another detection device such as a sensor for detecting orientation (e.g., a gyroscope or an acceleration sensor) as well as the optical sensor.

FIG. 9A illustrates an example in which the display portion 9631a and the display portion 9631b have the same display area; however, without limitation thereon, one of the display portions may be different from the other display portion in size or display quality. For example, one of them may be a display panel that can display higher-definition images than the other.

In FIG. 9B, the tablet terminal is folded, which includes the housing 9630, a solar battery 9633, a charge and discharge control circuit 9634, a battery 9635, and a DCDC converter 9636. FIG. 9B illustrates an example in which the charge and discharge control circuit 9634 includes the battery 9635 and the DCDC converter 9636.

Since the tablet terminal can be folded in two, the housing 9630 can be closed when the tablet is not in use. Thus, the display portions 9631a and 9631b can be protected, thereby providing a tablet terminal with high endurance and high reliability for long-term use.

In addition, the tablet terminal illustrated in FIGS. 9A and 9B can have a function of displaying a variety of data (e.g., a still image, a moving image, and a text image), a function of displaying a calendar, a date, the time, or the like on the display portion, a touch-input function of operating or editing the data displayed on the display portion by touch input, a function of controlling processing by a variety of software (programs), and the like.

The solar battery 9633, which is attached on the surface of the tablet terminal, supplies electric power to a touch panel, a display portion, an image signal processor, and the like. The solar cell 9633 is preferably provided on one or two surfaces of the housing 9630, because the battery 9635 can be charged efficiently. A lithium ion battery can be used as the battery 9635, which has a merit in reduction in size or the like.

Figure 9C:
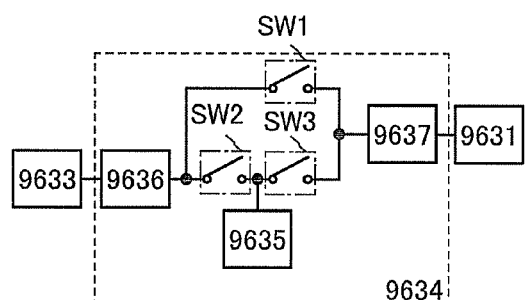

The structure and the operation of the charge and discharge control circuit 9634 illustrated in FIG. 9B are described using a block diagram in FIG. 9C. FIG. 9C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 are included in the charge and discharge control circuit 9634 in FIG. 9B.

First, an example of operation in the case where power is generated by the solar battery 9633 using external light is described. The voltage of power generated by the solar battery is raised or lowered by the DCDC converter 9636 to a voltage for charging the battery 9635. Then, when the power from the solar battery 9633 is used for the operation of the display portion 9631, the switch SW1 is turned on and the voltage of the power is raised or lowered by the converter 9637 to a voltage needed for the display portion 9631. On the other hand, when display on the display portion 9631 is not performed, the switch SW1 is turned off and the switch SW2 is turned on so that the battery 9635 is charged.

In this embodiment, the solar battery 9633 is described as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

As described above, electronic devices and lighting devices can be obtained by application of the light-emitting device of one embodiment of the present invention. The applicable range of the light-emitting device of one embodiment of the present invention is so wide that the light-emitting device can be applied to electronic devices in any field.

The structure described in this embodiment can be combined with any structure described in any of the above embodiments as appropriate.

This application is based on Japanese Patent Application serial no. 2011-260218 filed with Japan Patent Office on Nov. 29, 2011, the entire contents of which are hereby incorporated by reference.

What is claimed is:

1. A sealed structure comprising:
a substrate and a counter substrate respective surfaces of which face each other with a space therebetween; and
a glass layer which is in contact with both of the substrate and the counter substrate, defines a sealed space between the substrate and the counter substrate, and
when viewed in plan view, the glass layer comprises:
a corner portion in continuity with a first side portion and a second side portion, the corner portion being continuously formed from the first side portion to the second side portion, wherein one of an inner contour and an outer contour of the first side portion is a straight line and one of an inner contour and an outer contour of the second side portion is a straight line,
wherein an outer contour of the corner portion and an inner contour of the corner portion of the glass layer can each be described as a curve free of inflection points and singular points, when seen in the plan view, and
wherein a width of the corner portion of the glass layer is smaller than a width of the first side portion of the glass layer, the widths being defined as distances from the inner contour to the outer contour along a direction perpendicular to the inner contour.

2. The sealed structure according to claim 1,
wherein an entire surface of the glass layer in the corner portion and in contact with the substrate is welded to the substrate.

3. The sealed structure according to claim 1, further comprising:
a resin layer between the substrate and the counter substrate in an outside region of the corner portion of the glass layer,
wherein the resin layer is localized in the outside region of the corner portion.

4. The sealed structure according to claim 1,
wherein the outer contour of the corner portion of the glass layer has a radius of curvature greater than the inner contour of the corner portion.

5. The sealed structure according to claim 1,
wherein the glass layer comprises a glass material in direct contact with the substrate and the counter substrate, and continuously formed between the substrate and the counter substrate.

6. A light-emitting device comprising:
a substrate and a counter substrate respective surfaces of which face each other with a space therebetween; and
a glass layer which is in contact with both of the substrate and the counter substrate, defines a sealed space between the substrate and the counter substrate, and
when viewed in plan view, the glass layer comprises:
a corner portion in continuity with a first side portion and a second side portion, the corner portion being continuously formed from the first side portion to the second side portion,
wherein one of an inner contour and an outer contour of the first side portion is a straight line and one of an inner contour and an outer contour of the second side portion is a straight line,
wherein an outer contour of the corner portion and an inner contour of the corner portion of the glass layer can each be described as a curve free of inflection points and singular points, when seen in the plan view,
wherein the sealed space includes a light emitting element in which a layer containing a light-emitting organic compound is provided between a pair of electrodes,
wherein a width of the corner portion of the glass layer is smaller than a width of the first side portion of the glass layer, the widths being defined as distances from the inner contour to the outer contour along a direction perpendicular to the inner contour.

7. An electronic device wherein the light-emitting device according to claim 6 is used in a display portion.

8. A lighting device wherein the light-emitting device according to claim 6 is used in a light-emitting portion.

9. The light-emitting device according to claim 6,
wherein an entire surface of the glass layer in the corner portion and in contact with the substrate is welded to the substrate.

10. The light-emitting device according to claim 6, further comprising:
a resin layer between the substrate and the counter substrate in an outside region of the corner portion of the glass layer,
wherein the resin layer is localized in the outside region of the corner portion.

11. The light-emitting device according to claim 6,
wherein the outer contour of the corner portion of the glass layer has a radius of curvature greater than the inner contour of the corner portion.

12. The light-emitting device according to claim 6,
wherein the glass layer comprises a glass material in direct contact with the substrate and the counter substrate, and continuously formed between the substrate and the counter substrate.

13. A sealed structure manufacturing method comprising the steps of:
applying a frit paste on a substrate;
performing a pre-baking on the frit paste to form a glass layer;
disposing a counter substrate to make the counter substrate face the substrate, the counter substrate and the glass layer being in close contact with each other; and
irradiating the glass layer with laser light having a beam diameter greater than or equal to a width of a first side portion of the glass layer,
wherein the glass layer is in contact with both of the substrate and the counter substrate and defines a sealed space between the substrate and the counter substrate, and
when viewed in plan view, the glass layer comprises:
a corner portion in continuity with the first side portion and a second side portion, the corner portion being continuously formed from the first side portion to the second side portion,
wherein one of an inner contour and an outer contour of the first side portion is a straight line and one of an inner contour and an outer contour of the second side portion is a straight line,
wherein an outer contour of the corner portion and an inner contour of the corner portion of the glass layer can each be described as a curve free of inflection points and singular points, when seen in the plan view, and
wherein a width of the corner portion of the glass layer is smaller than the width of the first side portion of the glass layer, the widths being defined as distances from the inner contour to the outer contour along a direction perpendicular to the inner contour.

14. The sealed structure manufacturing method according to claim 13, further comprising the steps of:
forming a masking tape over the substrate prior to the step of applying the frit paste on the substrate; and
removing the masking tape prior to the step of performing a pre-baking on the frit paste,
wherein the frit paste is applied along a side surface of the masking tape.

15. The sealed structure manufacturing method according to claim 13,
wherein an entire surface of the glass layer in the corner portion and in contact with the substrate is welded to the substrate.

16. The sealed structure manufacturing method according to claim 13, further comprising the step of:
forming a resin layer between the substrate and the counter substrate in an outside region of the corner portion of the glass layer,
wherein the resin layer is localized in the outside region of the corner portion.

17. The sealed structure manufacturing method according to claim 13,
wherein the outer contour of the corner portion of the glass layer has a radius of curvature greater than the inner contour of the corner portion.

18. The sealed structure manufacturing method according to claim 13,
wherein the sealed space includes a light-emitting element in which a layer containing a light-emitting organic compound is provided between a pair of electrodes.

19. The sealed structure manufacturing method according to claim 13,
wherein the glass layer comprises a glass material in direct contact with the substrate and the counter substrate, and continuously formed between the substrate and the counter substrate.

* * * * *